United States Patent
Joo et al.

(10) Patent No.: US 12,406,715 B2
(45) Date of Patent: Sep. 2, 2025

(54) MEMORY DEVICE INCLUDING ROW-HAMMER TRACKING CIRCUIT AND OPERATING METHOD THEREOF

(71) Applicant: SK hynix Inc., Gyeonggi-do (KR)

(72) Inventors: No Geun Joo, Gyeonggi-do (KR); Jun Seok Noh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 215 days.

(21) Appl. No.: 18/459,418

(22) Filed: Sep. 1, 2023

(65) Prior Publication Data

US 2024/0355375 A1  Oct. 24, 2024

(30) Foreign Application Priority Data

Apr. 18, 2023  (KR) .................. 10-2023-0050701

(51) Int. Cl.
*G11C 11/40* (2006.01)
*G11C 11/406* (2006.01)

(52) U.S. Cl.
CPC ................... *G11C 11/406* (2013.01)

(58) Field of Classification Search
CPC .................................................. G11C 11/406
See application file for complete search history.

(56) References Cited

U.S. PATENT DOCUMENTS 11,462,291 B2 * 10/2022 Pan .................. G11C 11/40611
2022/0036960 A1    2/2022 Ingram et al.
2022/0147274 A1 *  5/2022 Kim .................. G11C 11/40618

FOREIGN PATENT DOCUMENTS

KR  10-2022-0062710 A  5/2022
KR  10-2022-0082706 A  6/2022

* cited by examiner

*Primary Examiner* — Vanthu T Nguyen
(74) *Attorney, Agent, or Firm* — IP & T GROUP LLP

(57) ABSTRACT

A memory device includes a row-hammer tracking circuit configured to: generate short interval signals each having one of first to n-th lengths based on input intervals between active commands, and generate a rate control signal based on whether a pattern of the short interval signals corresponds to a row-hammer attack pattern; and a target command issue circuit configured to adjust a frequency of a target refresh operation according to the rate control signal.

24 Claims, 18 Drawing Sheets

FIG. 2

(1) one type of S_GAP only looping (duplication)
(2) two types of S_GAP looping
(3) three types of S_GAP looping
(4) four types of S_GAP looping

FIG. 11A

| ACT | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 | 64 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| P1 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 |
| LAT | P | | | | | | | | | | | | | | | | | | | | | | | | | | | | | | | | | | | | | | | | | | | | | | | | | | | | | | | | | | | | | | | |

S200: D_FLAG = "H"

FIG. 11B

| ACT | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 | 64 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| P5 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 | 7 | 8 | 6 |
| LAT | P | C1 | C2 | C3 | | | | | | | | | | | | | | | | | | | | | | | | | | | | | | | | | | | | | | | | | | | | | | | | | | | | | | | | | | | | |

S200

S300: [7-8-6] TRACKING

FIG. 11C

| ACT | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 | 64 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| P6 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 | 6 | 7 | 8 | 9 |
| LAT | P | C1 | C2 | C3 | E | | | | | | | | | | | | | | | | | | | | | | | | | | | | | | | | | | | | | | | | | | | | | | | | | | | | | | | | | | | |

|←— S200 —→|←——————————————————— S300: [7-8-9] TRACKING ———————————————————→|

FIG. 11D

| ACT | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 | 64 |
|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|---|
| P7 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 | 6 | 7 | 7 | 6 |
| LAT | P | C1 | C2 | C3 | | | | | | | | | | | | | | | | | | | | | | | | | | | | | | | | | | | | | | | | | | | | | | | | | | | | | | | | | | | | |

|←— S200 —→|←——————————————————— S300: [7-7-6] TRACKING ———————————————————→|

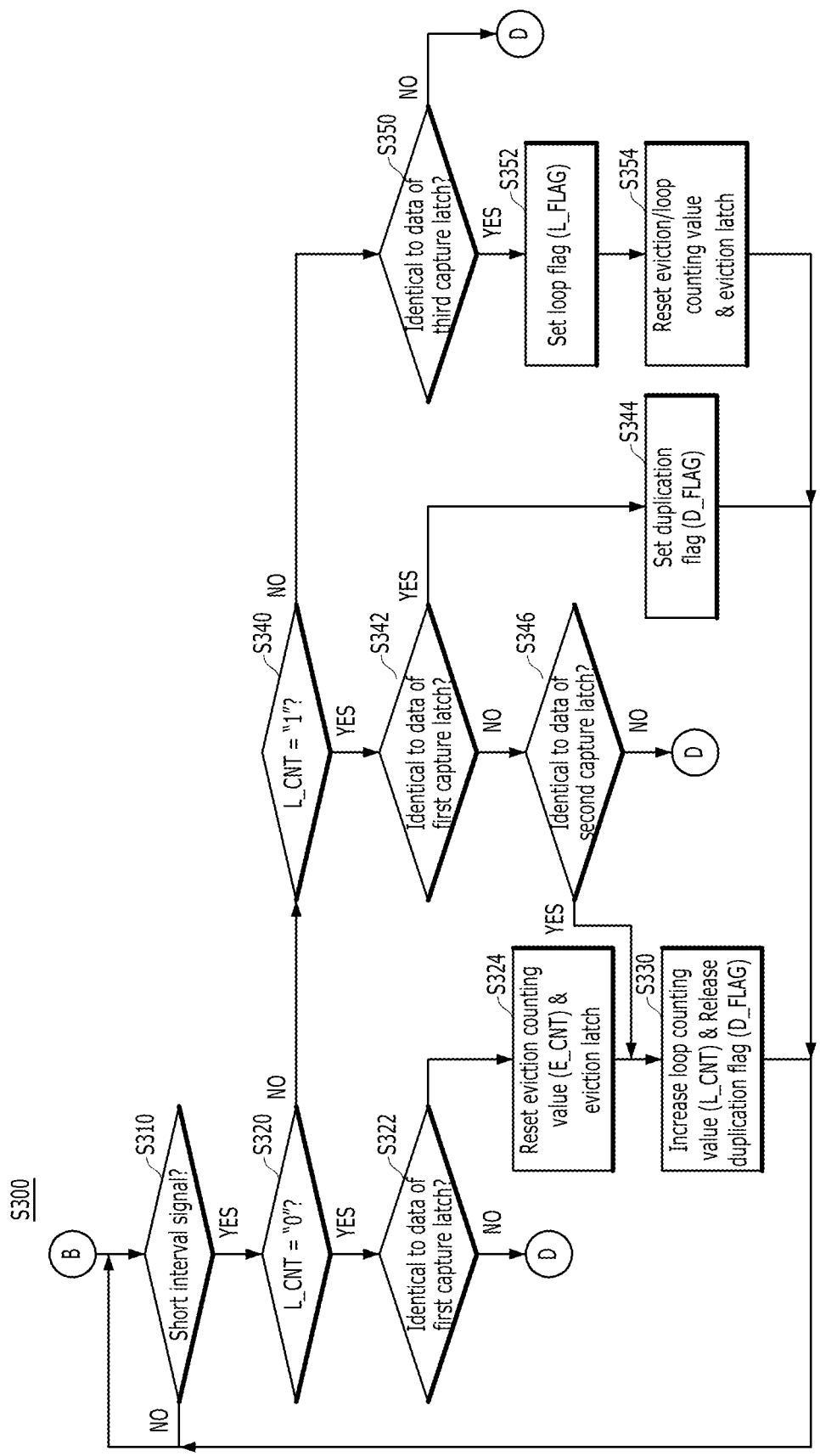

MEMORY DEVICE INCLUDING ROW-HAMMER TRACKING CIRCUIT AND OPERATING METHOD THEREOF

CROSS-REFERENCE TO RELATED APPLICATION

The present application claims the benefit of Korean Patent Application No. 10-2023-0050701, filed on Apr. 18, 2023, which is incorporated herein by reference in its entirety.

BACKGROUND

1. Field

Various embodiments of the present invention relate to semiconductor design technology, and more particularly, to a memory system including a memory device performing a target refresh operation for row-hammer mitigation.

2. Description of the Related Art

In addition to a normal refresh operation for sequentially refreshing a plurality of word lines, an additional refresh operation which will be, hereinafter, referred to as a 'target refresh operation', is being performed on a specific word line that is likely to lose data due to row hammering. The row hammering phenomenon refers to a phenomenon in which data of memory cells coupled to a specific word line or the word lines disposed adjacent to the word line are damaged due to a high number of activations of the corresponding word line. In order to prevent the row hammering phenomenon, a target refresh operation is performed on word lines disposed adjacent to a word line that is activated more than a predetermined number of times which is, hereinafter, referred to as a 'target word line'.

The target refresh operation may be performed according to a target refresh command that replaces some of normal refresh commands that instruct the normal refresh operation, or may be performed according to a refresh management command provided by an external controller. Recently, as a row-hammer risk increases, a method of efficiently performing a target refresh operation by a memory device has been studied.

SUMMARY

Embodiments of the present invention are directed to a memory device capable of monitoring intervals between active commands and detecting row-hammer attackable patterns to adjust a rate of a target refresh operation, and an operating method thereof.

According to an embodiment of the present invention, a memory device includes a row-hammer tracking circuit configured to: generate short interval signals each having one of first to n-th lengths based on input intervals between active commands, and generate a rate control signal based on whether a pattern of the short interval signals corresponds to a row-hammer attack pattern; and a target command issue circuit configured to adjust a frequency of a target refresh operation according to the rate control signal.

According to an embodiment of the present invention, a row-hammer tracking device includes a mode entry determination circuit configured to: generate short interval signals each having one of first to n-th lengths based on input intervals between active commands, and generate a mode entry signal based on a number of the short interval signals; a tracking control circuit configured to generate a capture enable signal or a tracking enable signal according to the mode entry signal; a tracking circuit configured to: capture a pattern of the short interval signals according to the capture enable signal, and generate, according to the tracking enable signal, a first flag signal and a second flag signal based on whether the captured pattern is repeated; and a rate control circuit configured to generate a rate control signal for adjusting, based on the first flag signal and the second flag signal, a frequency of a target refresh operation.

According to an embodiment of the present invention, an operating method of a memory device includes generating short interval signals each having one of first to n-th lengths based on input intervals between active commands; performing a capture operation for capturing a pattern of the short interval signals based on a number of the short interval signals; generating a first flag signal and a second flag signal based on whether the captured pattern of the short interval signals corresponds to a row-hammer attack pattern; and adjusting a frequency of a target refresh operation according to the first flag signal and the second flag signal.

Further, according to embodiments of the present invention, the memory device may minimize the power consumption and performance degradation by selectively adjusting the rate of the target refresh operation only in the event of a row-hammer attack.

BRIEF DESCRIPTION OF THE DRAWINGS

FIG. 2 is a diagram for describing various row-hammer attack patterns in accordance with an embodiment of the present invention.

FIGS. 11A to 11D are diagrams for describing the capture operation of FIGS. 10A and 10B.

FIGS. 12A and 12B are flowcharts for describing a tacking operation in accordance with an embodiment of the present invention.

DETAILED DESCRIPTION

Figure 1:
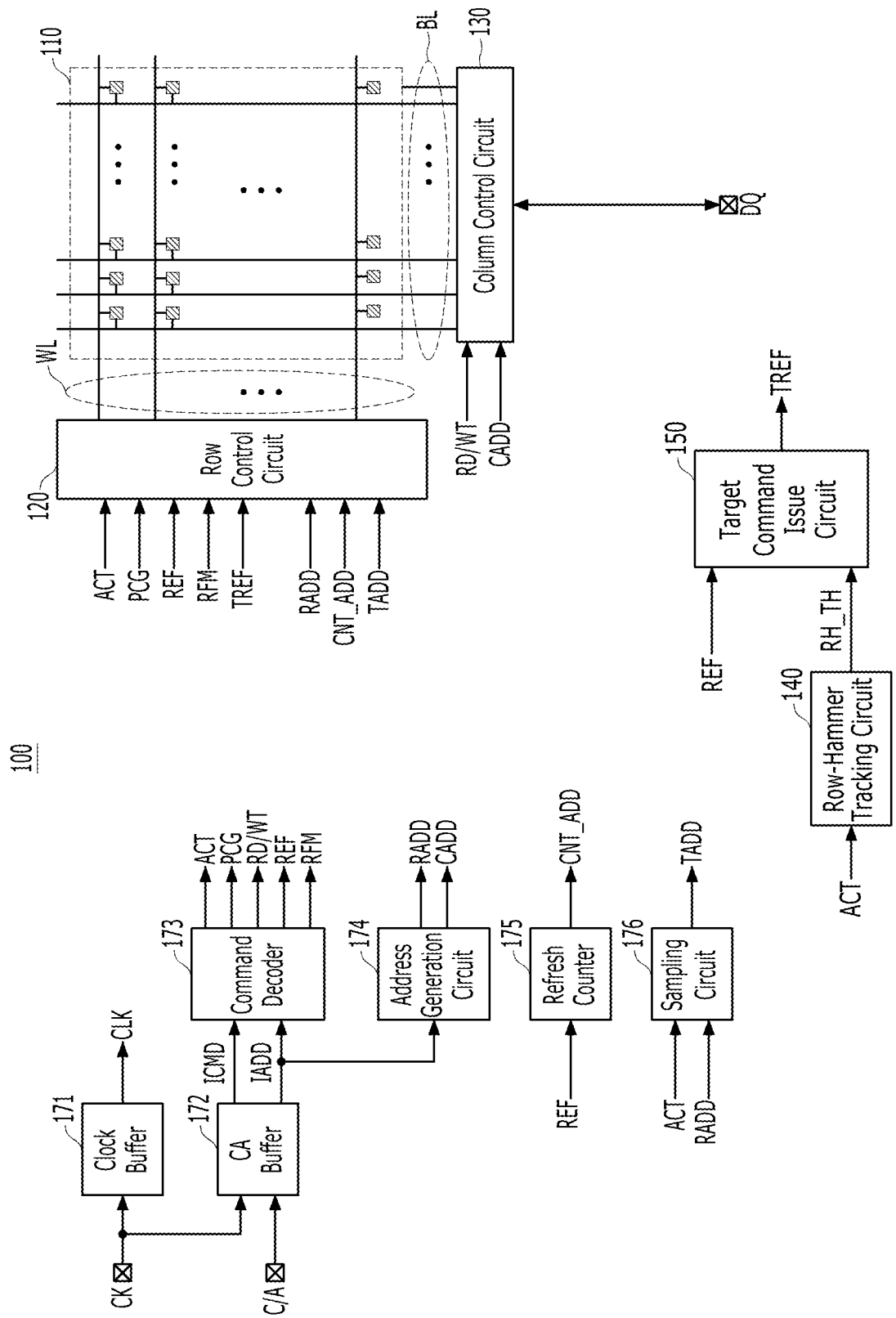
FIG. 1 is a block diagram illustrating a memory device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Hereinafter, a row control aspect related to a refresh operation will be mainly described.

FIG. 1 is a block diagram illustrating a memory device 100 in accordance with an embodiment of the present invention.

Referring to FIG. 1, the memory device 100 may include a memory cell region 110, a row control circuit 120, a column control circuit 130, a row-hammer tracking circuit 140, a target command issue circuit 150, a clock buffer 171, a command/address (CA) buffer 172, a command decoder 173, an address generation circuit 174, a refresh counter 175, and a sampling circuit 176.

The memory cell region 110 may include a plurality of memory cells MC respectively coupled to a plurality of word lines WL and a plurality of bit lines BL. The plurality of word lines WL may extend in a first direction (e.g., a row direction) and may be sequentially disposed in a second direction (e.g., a column direction). The plurality of bit lines BL may extend in the column direction and may be sequentially disposed in the row direction. The plurality of memory cells MC may be composed of memory cells that require a refresh operation to secure data retention time. The memory cell region 110 may be composed of at least one bank. The number of banks or the number of memory cells MC may be determined depending on the capacity of the memory device 100.

The clock buffer 171 may receive a clock signal CK from an external device (e.g., a memory controller). The clock buffer 171 may generate an internal clock signal CLK by buffering the clock signal CK. Depending on an embodiment, the memory controller 200 may transfer system clocks to the memory device 100 in a differential manner, and the memory device 100 may include clock buffers that receive the differential clocks, respectively.

The CA buffer 172 may receive a command/address signal C/A from the memory controller based on the clock signal CK. The CA buffer 172 may sample the command/address signal C/A based on the clock signal CK and output an internal command ICMD and an internal address IADD. Consequently, the first memory device may be synchronized with the clock signal CK.

The command decoder 173 may decode the internal command ICMD which is output from the CA buffer 172 to generate an active command ACT, a precharge command PCG, a read command RD, and a write command WT. Further, the command decoder 173 may decode the internal command ICMD to generate a normal refresh command as a periodic refresh command, and a refresh management command as a non-periodic refresh command.

The address generation circuit 174 may classify the internal address IADD received from the CA buffer 172 as a row address RADD and a column address CADD. Depending on an embodiment, the address generation circuit 174 may classify some bits of the internal address IADD as a row address RADD and classify the remaining bits as a column address CADD. The address generation circuit 174 may classify the internal address IADD as a row address RADD when an active operation is directed as a result of the decoding by the command decoder 173 and may classify the internal address IADD as a column address CADD when a read or write operation is directed. The plurality of word lines WL may be accessed by the row address RADD, and the plurality of bit lines BL may be accessed by the column address CADD.

The refresh counter 175 may generate a counting address CNT_ADD whose value increases sequentially every time the normal refresh command REF is input. The word lines WL may be sequentially refreshed during a normal refresh operation according to the counting address CNT_ADD.

The sampling circuit 176 may collect sampling addresses for a word line vulnerable to a row-hammer attack to output one of the sampling addresses as a target address TADD. For example, the sampling circuit 176 may store the row address RADD input with the active command ACT as one of the sampling addresses, and select and output one of the sampling addresses as the target address TADD at a random time. According to an embodiment, the sampling circuit 175 may calculate adjacent addresses of the selected address and output the calculated adjacent addresses as the target address TADD. Depending on an embodiment, the sampling circuit 175 may output the target address TADD according to a target refresh command TREF or the refresh management command RFM.

The row-hammer tracking circuit 140 may generate short interval signals (S_GAP in FIG. 2) each having one of first to n-th lengths by monitoring access intervals between the word lines WL of the memory cell region 110, that is, input intervals between the active commands ACT. When the active command ACT is input, the row-hammer tracking circuit 140 may detect the input intervals between the active commands ACT by measuring an interval between a previously inputted active command and a currently inputted active command. The row-hammer tracking circuit 140 may generate the short interval signal S_GAP when the input interval is shorter than a reference interval. For example, the row-hammer tracking circuit 140 may set the reference interval to approximately 100 ns and detect a case where the input interval is less than 100 ns to generate the short interval signal S_GAP. In an embodiment of the present invention, the reference interval may be determined by the following Equation 1.

$$tRCx = tRCmin/k \qquad \text{[Equation 1]}$$

In Equation 1, tRCx denotes the reference interval, tRCmin denotes a minimum time interval between active commands for the same bank, and k is a ratio of an internally defensible row-hammer defense capability to a maximum defense capability.

For example, when tRCmin is set to 60 ns in the specification and k is set to 0.6, the reference interval tRCx of 100 ns may be calculated from Equation 1.

The input interval between the active commands ACT may be determined by the minimum time interval tRCmin between the active commands for the same bank (hereinafter referred to as "RAS cycle time"). For example, if the minimum RAS cycle time tRCmin is defined as 60 ns in the LPDDR5 specification, the row-hammer tracking circuit 140 may define an input interval ranging from 60 ns to 69 ns as a first length, an input interval ranging from 70 ns to 79 ns as a second length, an input interval ranging from 80 ns to 89 ns as a third length, and an input interval ranging from 90 ns and 99 ns as a fourth length. The row-hammer tracking circuit 140 may generate the short interval signal S_GAP with one of the first to fourth lengths when the active command ACT is input. In this disclosure, when a current active command ACT is input with a certain time interval with respect to a previous active command ACT, a short interval signal S_GAP may be generated to correspond to the current active command ACT and may have a length corresponding to the certain time interval.

In addition, the row-hammer tracking circuit 140 may generate a rate control signal RH_TH by determining whether a pattern of the short interval signals S_GAP corresponds to a row-hammer attack pattern. For example, the row-hammer tracking circuit 140 may determine that the pattern of the short interval signals S_GAP correspond to the row-hammer attack pattern when the short interval signals S_GAP of the same length among the first to fourth length are consecutive, or when a combination of two or more short interval signals S_GAP of the different lengths is repetitive.

Referring to FIG. 2, various row-hammer attack patterns such as cases (1), (2), (3), and (4) according to an embodiment of the present invention are illustrated. In FIG. 2, the reference numeral "6" may represent a short interval signal S_GAP having a first length, the reference numeral "7" may represent a short interval signal S_GAP having a second length, the reference numeral "8" may represent a short interval signal S_GAP having a third-length, and the reference numeral "9" may represent a short interval signal S_GAP having a fourth-length.

Among first to ninth patterns P1 to P9, the first pattern P1 may correspond to the case (1) where the short interval signals S_GAP of the same length (or type) are consecutive. The second to fourth patterns P2 to P4 may correspond to the case (2) where the short interval signals S_GAP of two different lengths (or types) are alternately repeated a predetermined number of times. The fifth pattern P5 may correspond to the case (3) where the short interval signals S_GAP of three different lengths (or types) are alternately repeated a predetermined number of times, and the sixth pattern P6 may correspond to the case (4) where the short interval signals S_GAP of four different lengths (or types) are alternately repeated a predetermined number of times. The seventh pattern P7 may correspond to the case (3) where the short interval signals S_GAP of three different lengths (or types) are alternately repeated a predetermined number of times. The eighth pattern P8 may correspond to the case (2) where the short interval signals S_GAP do not have a repetition pattern during an initial section, but the short interval signals S_GAP of two different lengths are alternately repeated during a subsequent section. On the other hand, since the ninth pattern P9 does not correspond to any of the cases (1), (2), (3), and (4), it does not correspond to a row-hammer attack pattern.

Referring back to FIG. 1, the target command issue circuit 150 may set a target threshold value according to the rate control signal RH_TH and issue the target refresh command TREF whenever the number of inputs of the normal refresh command REF reaches the target threshold value. That is, the target command issue circuit 150 may adjust an issuance frequency of the target refresh command TREF according to the rate control signal RH_TH. The refresh management command RFM may be a command provided by the memory controller for a target refresh operation, and the target refresh command TREF may be a command generated by the memory device 100 itself for a target refresh operation. For reference, a refresh operation may include a normal refresh operation in which the memory device 100 sequentially refreshes a plurality of word lines WL, and a target refresh operation in which one or more adjacent word lines adjacent to a target word line with a high or high active frequency. The memory device 100 may perform the normal refresh operation according to the normal refresh command REF and the target refresh operation corresponding to the target address TADD according to the refresh management command RFM that is provided from the memory controller, or the target refresh command TREF that is internally generated.

Depending on an embodiment, the target command issue circuit 150 may include a mode register circuit that may store a refresh rate according to a temperature, and change a set value of the refresh rate according to the rate control signal RH_TH. The target command issue circuit 150 may finally adjust a rate (hereinafter, referred to as "a target refresh rate") of the target refresh operation by setting the target threshold value according to the refresh rate stored in the mode register circuit.

Referring back to FIG. 1, the row control circuit 120 may be coupled to the memory cells MC in the memory cell region 110 through the plurality of word lines WL. The row control circuit 120 may select or activate at least one word line selected by the row address RADD when the active command ACT is input and deactivate the activated word line when the precharge command PCG is input. The row control circuit 120 may perform the normal refresh operation on a word line corresponding to the counting address CNT_ADD when the normal refresh command REF is input. The row control circuit 120 may perform the target refresh operation on one or more adjacent word lines of the target word line corresponding to the target address TADD when the refresh management command RFM or the target refresh command TREF is input. According to an embodiment, the memory controller may provide a target address for a word line vulnerable to a row-hammer attack, to the memory device 100 together with the refresh management command RFM. In this case, the row control circuit 120 may perform a target refresh operation of activating adjacent word lines corresponding to the row address RADD (i.e., the target address) according to the refresh management command RFM.

The column control circuit 130 may select and amplify a predetermined number of bit lines BL corresponding to the column address CADD, and transfer data DQ between the memory cell region 110 and a data pad when the read command RD or the write command WT is input. For example, the column control circuit 130 may include a column selection circuit, a sense amplifier circuit, and a data input/output circuit. The column selection circuit may decode the column address CADD to select a predetermined number of bit lines BL. The sense amplifier circuit may sense and amplify data of the selected bit lines BL. During an active operation or a refresh operation, the sense amplifier circuit is enabled to sense, amplify and restore the data of the selected bit lines BL. The data input/output circuit may receive the data DQ to be written to the memory cell region 110 during a write operation according to the write command WT, and transmit the data DQ read from the memory cell region 110 during a read operation according to the read command RD.

As described above, in the embodiment of the present invention, the target refresh rate may be adjusted by monitoring the input intervals between the active commands ACT and detecting the row-hammer attack patterns. Therefore, by selectively adjusting the target refresh rate only in the event of a row-hammer attack, it is possible to reduce the row-hammer risk while minimizing the power consumption and performance degradation.

Hereinafter, a detailed configuration and operation of the present invention will be described with reference to the drawings. Hereinafter, a method of detecting a row-hammer attack pattern in which the row-hammer tracking circuit 140 detects a case where short interval signals S_GAP of the same length are consecutive, or a case where a combination of short interval signals having two to four different lengths is repetitive, will be described.

Figure 3:
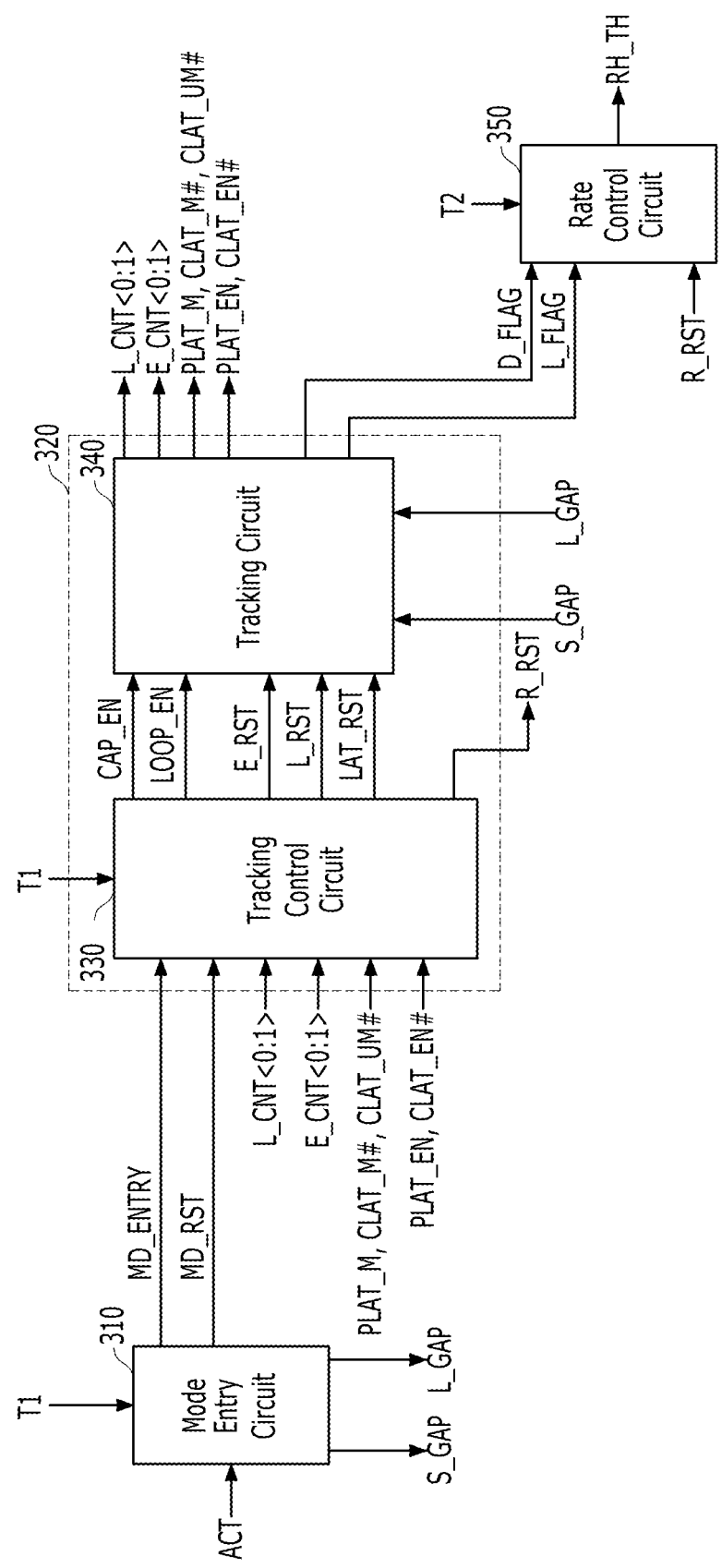
FIG. 3 is a detailed block diagram illustrating a row-hammer tracking circuit of FIG. 1.

FIG. 3 is a detailed block diagram illustrating the row-hammer tracking circuit 140 of FIG. 1.

Referring to FIG. 3, the row-hammer tracking circuit 140 may include a mode entry determination circuit 310, a tracking operation circuit 320, and a rate control circuit 350.

The mode entry determination circuit 310 may generate short interval signals S_GAP or long interval signals L_GAP by monitoring the input intervals between the active commands ACT. The mode entry determination circuit 310 may generate a mode entry signal MD_ENTRY or a mode reset signal MD_RST based on the number of the short interval signals S_GAP every first set time T1. A detailed configuration of the mode entry determination circuit 310 will be described in FIG. 4.

The tracking operation circuit 320 may generate a duplication flag signal D_FLAG and a loop flag signal L_FLAG by tracking a pattern of the short interval signals S_GAP according to the mode entry signal MD_ENTRY and the mode reset signal MD_RST. The tracking operation circuit 320 may detect a case where the short interval signals S_GAP of the same length are consecutive to generate the duplication flag signal D_FLAG, and may detect a case where a combination of the short interval signals S_GAP of two or more different lengths are repetitive to generate the loop flag signal L_FLAG.

In detail, the tracking operation circuit 320 may include a tracking control circuit 330 and a tracking circuit 340.

The tracking control circuit 330 may generate a capture enable signal CAP_EN, a tracking enable signal LOOP_EN, a tracking reset signals E_RST, L_RST and LAT_LST, and a rate reset signal R_RST, according to the mode entry signal MD_ENTRY, the mode reset signal MD_RST and a plurality of tracking signals L_CNT<0:1>, E_CNT<0:1>, PLAT_M, CLAT_M# (where # is an integer from 1 to 3), CLAT_UM#, PLAT_EN, and CLAT_EN#. The tracking control circuit 330 may control the capture enable signal CAP_EN such that an activation period of the capture enable signal CAP_EN does not exceed the first set time T1.

For reference, the capture enable signal CAP_EN is a signal activated during a capture operation, and the tracking enable signal LOOP_EN is a signal activated during a tracking operation. The tracking signals L_CNT<0:1>, E_CNT<0:1>, PLAT_M, CLAT_M#, CLAT_UM#, PLAT_EN, and CLAT_EN# are signals generated by the tracking circuit 340 during the capture operation and the tracking operation. The tracking signals L_CNT<0:1>, E_CNT<0:1>, PLAT_M, CLAT_M#, CLAT_UM#, PLAT_EN, and CLAT_EN# may include a loop counting value L_CNT<0:1>, an eviction counting value E_CNT<0:1>, a point match signal PLAT_M, first to third capture match signals CLAT_M#, first to third capture unmatch signals CLAT_UM#, a point latch valid signal PLAT_EN, and first to third capture latch valid signals CLAT_EN#. The tracking reset signals E_RST, L_RST and LAT_LST are signals for selectively initializing configurations of the tracking circuit 340, may include an eviction reset signal E_RST, a loop reset signal L_RST and a latch reset signal LAT_RST. The capture enable signal CAP_EN, the tracking enable signal LOOP_EN, the eviction reset signal E_RST, the loop reset signal L_RST, and the latch reset signal LAT_RST may be provided to the tracking circuit 340. The rate reset signal R_RST is a signal for initializing the rate control signal RH_TH, and may be provided to the rate control circuit 350. A detailed configuration of the tracking control circuit 330 will be described in FIG. 5.

The tracking circuit 340 may capture (i.e., store) the pattern of the short interval signals S_GAP during the capture operation defined by the capture enable signal CAP_EN, and generate the duplication flag signal D_FLAG and the loop flag signal L_FLAG by tracking whether the captured pattern is repeated during the tracking operation defined by the tracking enable signal LOOP_EN. The tracking circuit 340 may include a point latch (P_LAT in FIG. 7), first to third capture latches (C_LAT1 to C_LAT3 in FIG. 7), an eviction latch (E_LAT in FIG. 7), a loop counter (343 in FIG. 6), and an eviction counter (345 in FIG. 6). The tracking circuit 340 may selectively initialize the point latch P_LAT, the first to third capture latches C_LAT1 to C_LAT3, the eviction latch E_LAT, the loop counter 343, and the eviction counter 345, according to the tracking reset signals E_RST, L_RST and LAT_LST. The tracking circuit 340 may perform the capture operation and the tracking operation to generate the tracking signals L_CNT<0:1>, E_CNT<0:1>, PLAT_M, CLAT_M#, CLAT_UM#, PLAT_EN, and CLAT_EN#. A detailed configuration and operation of the tracking circuit 340 will be described with reference to FIGS. 6 and 7.

The rate control circuit 350 may generate the rate control signal RH_TH based on the duplication flag signal D_FLAG and the loop flag signal L_FLAG. The rate control circuit 350 may check the duplication flag signal D_FLAG and the loop flag signal L_FLAG every second set time T2 and generate the rate control signal RH_TH so that the target refresh rate is more increased (i.e., frequent) when the duplication flag signal D_FLAG or the loop flag signal L_FLAG is set. The rate control circuit 350 may initialize the rate control signal RH_TH to a preset default value according to the rate reset signal R_RST.

Figure 4:
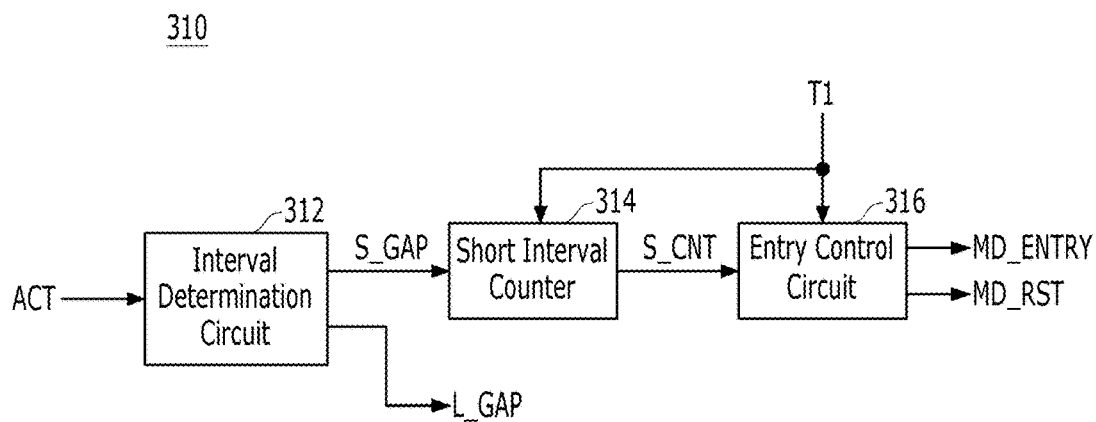
FIG. 4 is a detailed configuration diagram illustrating a mode entry determination circuit of FIG. 3.

FIG. 4 is a detailed configuration diagram illustrating the mode entry determination circuit 310 of FIG. 3.

Referring to FIG. 4, the mode entry determination circuit 310 may include an interval determination circuit 312, a short interval counter 314 and an entry control circuit 316.

The interval determination circuit 312 may measure the input interval of the active commands ACT by monitoring an interval between a previously inputted active command and a currently inputted active command, based on a reference interval. The interval determination circuit 312 may detect when the input interval is shorter than the reference interval to generate the short interval signals S_GAP and detect when the input interval is equal to or longer than the reference interval to generate the long interval signals L_GAP. For example, the interval determination circuit 312 may detect when the input interval is less than 100 ns to generate the short interval signals S_GAP and detect when the input interval is equal to or longer than 100 ns to generate the long interval signals L_GAP.

The short interval counter 314 may generate a short counting value S_CNT by counting the number of the short interval signals S_GAP. The short interval counter 314 may be initialized every first set time T1.

The entry control circuit 316 may generate the mode entry signal MD_ENTRY and the mode reset signal MD_RST according to the short counting value S_CNT. The entry control circuit 316 may activate the mode entry signal MD_ENTRY and deactivate the mode reset signal MD_RST when the short counting value S_CNT is greater than a first threshold within the first set time T1. On the other hand, entry control circuit 316 may deactivate the mode entry signal MD_ENTRY and activate the mode reset signal MD_RST when the short counting value S_CNT is less than or equal to the first threshold. For reference, the mode entry signal MD_ENTRY is a signal that determines an entry into a tracking mode to be described below, and the mode reset signal MD_RST is a signal that determines an end of the tracking mode by initializing all configurations of the row-hammer tracking circuit 140.

Figure 5:
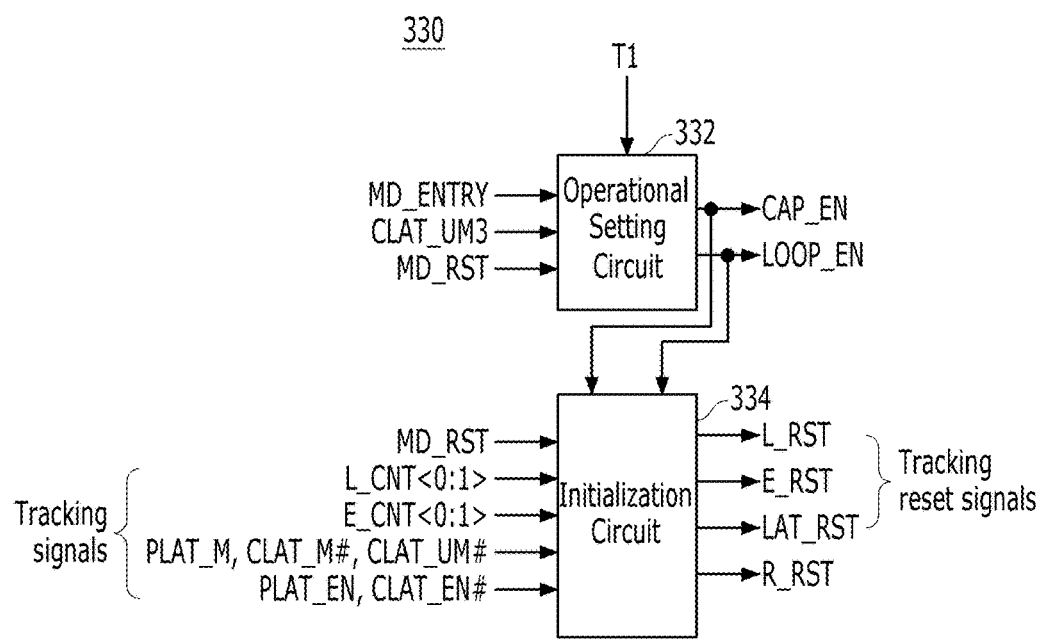
FIG. 5 is a detailed configuration diagram illustrating a tracking control circuit of FIG. 3.

FIG. 5 is a detailed configuration diagram illustrating the tracking control circuit 330 of FIG. 3.

Referring to FIG. 5, the tracking control circuit 330 may include an operational setting circuit 332 and an initialization circuit 334.

The operational setting circuit 332 may activate the capture enable signal CAP_EN or the tracking enable signal LOOP_EN according to the mode entry signal MD_ENTRY and disable both the capture enable signal CAP_EN or the tracking enable signal LOOP_EN according to the mode reset signal MD_RST. The operational setting circuit 332 may control the capture enable signal CAP_EN such that the activation period of the capture enable signal CAP_EN does not exceed the first set time T1. The operational setting circuit 332 may activate the capture enable signal CAP_EN when the mode entry signal MD_ENTRY is activated. The operational setting circuit 332 may activate the tracking enable signal LOOP_EN according to a signal (e.g., the third capture unmatch signal CLAT_UM3) indicating a completion of the capture operation is completed, or activate the tracking enable signal LOOP_EN when the activation period of the capture enable signal CAP_EN reaches the first set time T1. The operational setting circuit 332 may activate the tracking enable signal LOOP_EN after maintaining the state of capture enable signal CAP_EN when the mode entry signal MD_ENTRY is activated in a state that the capture enable signal CAP_EN is activated. That is, the operational setting circuit 332 may control the tracking operation to be performed after the capture operation is completed. The operational setting circuit 332 may control the capture enable signal CAP_EN and the tracking enable signal LOOP_EN to be activated complementary to each other in an activation period of the mode entry signal MD_ENTRY.

The initialization circuit 334 may generate the tracking reset signals E_RST, L_RST and LAT_LST and the rate reset signal R_RST, according to the capture enable signal CAP_EN, the tracking enable signal LOOP_EN, the mode reset signal MD_RST and the tracking signals L_CNT<0:1>, E_CNT<0:1>, PLAT_M, CLAT_M#, CLAT_UM#, PLAT_EN, and CLAT_EN#. The initialization circuit 334 may activate both the tracking reset signals E_RST, L_RST and LAT_LST and the rate set signal RST when the mode reset MD_RST is activated or the eviction counting value E_CNT<0:1> is greater than a second threshold. The initialization circuit 334 may selectively activate the eviction reset signal E_RST and the loop reset signal L_RST according to the capture enable signal CAP_EN, the tracking enable signal LOOP_EN, the loop counting value L_CNT<0:1>, the point match signal PLAT_M, the first to third capture match signals CLAT_M#, the first to third capture unmatch signals CLAT_UM#, the point latch valid signal PLAT_EN, and the first to third capture latch valid signals CLAT_EN#.

For example, the initialization circuit 334 may activate the eviction reset signal E_RST when any of the point latch valid signal PLAT_EN, the point match signal PLAT_M, the first capture latch valid signal CLAT_EN1, the first capture match signal CLAT_M1, the third capture match signal CLAT_M3 and the third capture unmatch signal CLAT_UM3, are in a state that the capture enable signal CAP_EN is activated. The initialization circuit 334 may activate the eviction reset signal E_RST when the loop counting value L_CNT<0:1> becomes "0" and the first capture latch valid signal CLAT_EN1 is activated, or when the loop counting value L_CNT<0:1> becomes "2" and the third capture match signal CLAT_M3 is activated, in a state that the tracking enable signal LOOP_EN is activated. The initialization circuit 334 may activate the loop reset signal L_RST when the loop counting value L_CNT<0:1> becomes "2" and the third capture match signal CLAT_M3 is activated.

Figure 6:
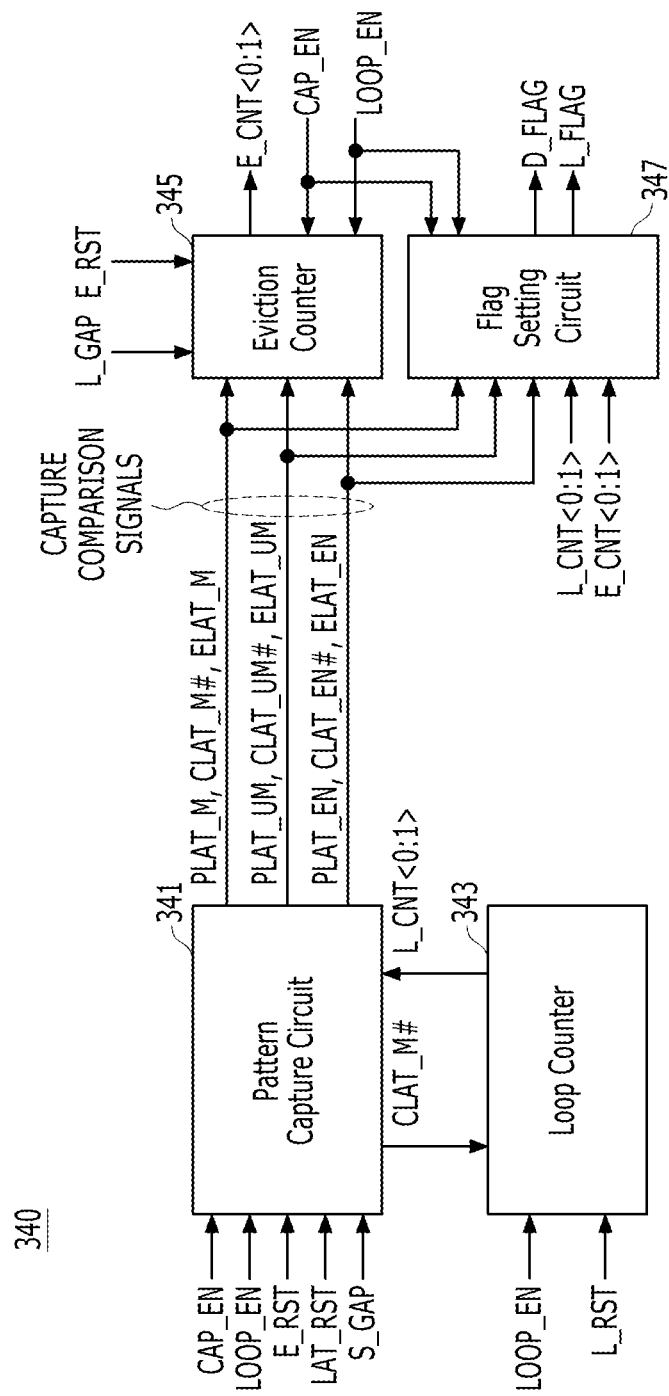
FIG. 6 is a detailed configuration diagram illustrating a tracking circuit of FIG. 3.
Figure 7:
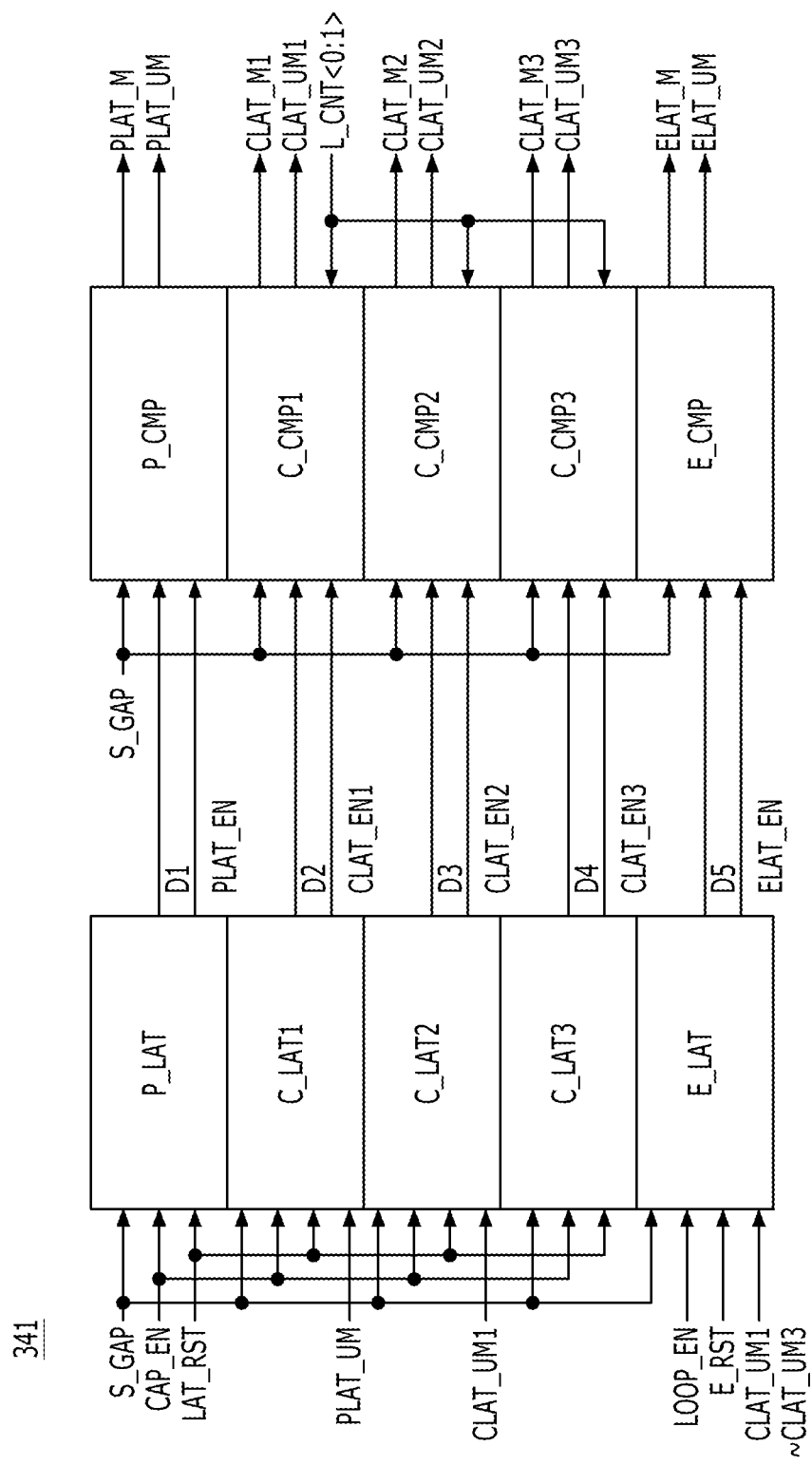
FIG. 7 is a detailed configuration diagram illustrating a pattern capture circuit of FIG. 6.

FIG. 6 is a detailed configuration diagram illustrating the tracking circuit 340 of FIG. 3. FIG. 7 is a detailed configuration diagram illustrating a pattern capture circuit 341 of FIG. 6.

Referring to FIG. 6, the tracking circuit 340 may include the pattern capture circuit 341, a loop counter 343, an eviction counter 345, and a flag setting circuit 347.

The pattern capture circuit 341 may generate a plurality of match signals PLAT_M, CLAT_M# and ELAT_M, a plurality of unmatch signals PLAT_UM, CLAT_UM# and ELAT_UM, and a plurality of latch valid signals PLAT_EN, CLAT_EN# and ELAT_EN, according to the capture enable signal CAP_EN, the tracking enable signal LOOP_EN, the eviction reset signal E_RST, the latch reset signal LAT_RST, the short interval signals S_GAP and the loop counting value L_CNT<0:1>. The plurality of match signals PLAT_M, CLAT_M# and ELAT_M, the plurality of unmatch signals PLAT_UM, CLAT_UM# and ELAT_UM, and the plurality of latch valid signals PLAT_EN, CLAT_EN# and ELAT_EN may be defined as capture comparison signals. The pattern capture circuit 341 may capture the pattern of the short interval signals S_GAP according to the capture enable signal CAP_EN, and generate the capture comparison signals by comparing the respective short interval signals S_GAP with the captured pattern according to the tracking enable signal LOOP_EN and the loop counting value L_CNT<0:1>.

For reference, the plurality of match signals PLAT_M, CLAT_M# and ELAT_M may include the point match signal PLAT_M, the first to third capture match signals CLAT_M# and an eviction match signal ELAT_M. The plurality of unmatch signals PLAT_UM, CLAT_UM# and ELAT_UM may include the point unmatch signal PLAT_UM, the first to third capture unmatch signals CLAT_UM# and an eviction unmatch signal ELAT_UM. The plurality of latch valid signals PLAT_EN, CLAT_EN# and ELAT_EN may include the point latch valid signal PLAT_EN, the first to third capture latch valid signals CLAT_EN# and an eviction latch valid signal ELAT_EN.

Referring to FIG. 7, the pattern capture circuit 341 may include the point latch P_LAT, the first to third capture latches C_LAT1 to C_LAT3, the eviction latch E_LAT, a point comparator P_CMP, first to third capture comparators C_CMP1 to C_CMP3, an eviction comparator E_CMP. The point latch P_LAT and the first to third capture latches C_LAT1 to C_LAT3 may be initialized by the latch reset signal LAT_RST, and the eviction latch E_LAT may be initialized by the eviction reset signal E_RST.

The point latch P_LAT may be enabled according to the capture enable signal CAP_EN to store the short interval signal S_GAP. The point latch P_LAT may activate the point latch valid signal PLAT_EN when data stored therein is valid. The point latch P_LAT may maintain the stored data when the point latch valid signal PLAT_EN is activated. The point comparator P_CMP may compare the stored data D1 of the point latch P_LAT with the short interval signal S_GAP according to the point latch valid signal PLAT_EN, to activate the point match signal PLAT_M when a comparison result matches and activate the point unmatch signal PLAT_UM when the comparison result does not match.

The first capture latch C_LAT1 may be enabled according to the capture enable signal CAP_EN and the point unmatch signal PLAT_UM to store the short interval signal S_GAP. The first capture latch C_LAT1 may activate the first capture latch valid signal CLAT_EN1 when data stored therein is valid. The first capture latch C_LAT1 may maintain the stored data when the first capture latch valid signal CLAT_EN1 is activated. The first capture comparator C_CMP1 may compare the stored data D2 of the first capture latch C_LAT1 with the short interval signal S_GAP according to the first capture latch valid signal CLAT_EN1 or the loop counting value L_CNT<0:1>, to activate the first capture match signal CLAT_M1 when a comparison result matches, and activate the first capture unmatch signal CLAT_UM1 when the comparison result does not match. For example, the first capture comparator C_CMP1 may compare the stored data D2 of the first capture latch C_LAT1 with the short interval signal S_GAP when the loop counting value L_CNT <0:1> becomes "0" or "1".

The second capture latch C_LAT2 may be enabled according to the capture enable signal CAP_EN and the first capture unmatch signal CLAT_UM1 to store the short interval signal S_GAP. The second capture latch C_LAT2 may activate the second capture latch valid signal CLAT_EN2 when data stored therein is valid. The second capture latch C_LAT2 may maintain the stored data when the second capture latch valid signal CLAT_EN2 is activated. The second capture comparator C_CMP2 may compare the stored data D3 of the second capture latch C_LAT2 with the short interval signal S_GAP according to the second capture latch valid signal CLAT_EN2 or the loop counting value L_CNT<0:1>, to activate the second capture match signal CLAT_M2 when a comparison result matches, and activate the second capture unmatch signal CLAT_UM2 when the comparison result does not match. For example, the second capture comparator C_CMP2 may compare the stored data D3 of the second capture latch C_LAT2 with the short interval signal S_GAP when the loop counting value L_CNT <0:1> becomes "1".

The third capture latch C_LAT3 may be enabled according to the capture enable signal CAP_EN to store the short interval signal S_GAP. The third capture latch C_LAT3 may activate the third capture latch valid signal CLAT_EN3 when data stored therein is valid. The third capture latch C_LAT3 may maintain the stored data when the third capture latch valid signal CLAT_EN3 is activated. The third capture comparator C_CMP3 may compare the stored data D4 of the third capture latch C_LAT3 with the short interval signal S_GAP according to the third capture latch valid signal CLAT_EN3 or the loop counting value L_CNT<0:1>, to activate the third capture match signal CLAT_M3 when a comparison result matches, and activate the third capture unmatch signal CLAT_UM3 when the comparison result does not match. For example, the third capture comparator C_CMP3 may compare the stored data D4 of the third capture latch C_LAT3 with the short interval signal S_GAP when the loop counting value L_CNT <0:1> becomes "2".

The eviction latch E_LAT may be enabled according to the loop enable signal LOOP_EN and the first to third capture unmatch signals CLAT_UM1 to CLAT_UM3 to store the short interval signal S_GAP. The eviction latch E_LAT may activate the eviction latch valid signal ELAT_EN when data stored therein is valid. The eviction latch E_LAT may maintain the stored data when the eviction latch valid signal ELAT_EN is activated. The eviction comparator E_CMP may compare the stored data D5 of the eviction latch E_LAT with the short interval signal S_GAP according to the eviction latch valid signal ELAT_EN, to activate the eviction match signal ELAT_M when a comparison result matches and activate the eviction unmatch signal ELAT_UM when the comparison result does not match.

For reference, the number of the point latch P_LAT and the first to third capture latches C_LAT1 to C_LAT3 may be determined by the number of the short interval signals S_GAP of different lengths repeated in the same pattern. For example, when the short interval signals S_GAP of four different lengths are repeated in the same pattern, three capture latches C_LAT1 to C_LAT3 may be provided.

Referring back to FIG. 6, the loop counter 343 may generate the loop counting value L_CNT<0:1> according to the tracking enable signal LOOP_EN, the loop reset signal L_RST, and the first to third capture match signals CLAT_M#. The loop counter 343 may be enabled according to the tracking enable signal LOOP_EN, and increase a value of the loop counting value L_CNT<0:1> by "+1" when the loop counting value L_CNT<0:1> becomes "0" and the first capture match signal CLAT_M1 is activated, or when the loop counting value L_CNT<0:1> becomes "1" and the second capture match signal CLAT_M2 is activated. The loop counter 343 may initialize the loop counting value L_CNT<0:1> according to the loop reset signal L_RST.

The eviction counter 345 may generate the eviction counting value E_CNT<1:0> according to the capture enable signal CAP_EN, the tracking enable signal LOOP_EN, the eviction reset signal E_RST, the long interval signals L_GAP, and the capture comparison signals. When the long interval signals L_GAP are input while the capture enable signal CAP_EN and the point latch valid signal PLAT_EN are activated, the eviction counter 345 may increase the eviction counting value E_CNT<0:1> by "+1". When any one of the first to third capture unmatch signals CLAT_UM1 to CLAT_UM3 is activated and the eviction unmatch signal ELAT_UM is activated in a state that the tracking enable signal LOOP_EN is activated, the eviction counter 345 may increase the eviction counting value E_CNT<0:1> by "+1". The eviction counter 345 may be initialized according to the eviction reset signal E_RST.

The flag setting circuit 347 may set or release the duplication flag signal D_FLAG and the loop flag signal L_FLAG according to the capture enable signal CAP_EN, the tracking enable signal LOOP_EN, the loop counting value L_CNT<0:1>, the eviction counting value E_CNT<0:1>, and the capture comparison signals. Hereinafter, the setting of a flag signal may mean activation the flag signal to a logic high level, and the releasing of a flag signal may mean deactivation the flag signal to a logic low level.

For example, the flag setting circuit 347 may set the duplication flag signal D_FLAG when the point match signal PLAT_M, the first capture match signal CLAT_M1, or the third capture match signal CLAT_M3 is activated in a state that the capture enable signal CAP_EN is activated. The flag setting circuit 347 may release the duplication flag signal D_FLAG when the third capture unmatch signal CLAT_UM3 is activated in a state that the capture enable signal CAP_EN is activated. The flag setting circuit 347 may set the duplication flag signal D_FLAG when the eviction match signal ELAT_M is activated, or when the loop counting value L_CNT<0:1> becomes "1" and the first capture match signal CLAT_M1 is activated, in a state that tracking enable signal LOOP_EN is activated. The flag setting circuit 347 may release the duplication flag signal D_FLAG when the loop counting value L_CNT<0:1> becomes "0" and the first capture match signal CLAT_M1 is activated, or when the loop counting value L_CNT<0:1> becomes "1" and the second capture match signal CLAT_M2 is activated, in a state that tracking enable signal LOOP_EN is activated. The flag setting circuit 347 may set the loop flag signal L_FLAG when the loop counting value L_CNT<0:1> becomes "2" and the third capture match signal CLAT_M3 is activated in a state that the tracking enable signal LOOP_EN activated. The flag setting circuit 347 may release both the duplication flag signal D_FLAG and the loop flag signal L_FLAG when the eviction counting value E_CNT <0:1> is greater than the second threshold.

Hereinafter, an operation of the memory device 100 according to an embodiment of the present invention will be described with reference to the drawings.

Figure 8:
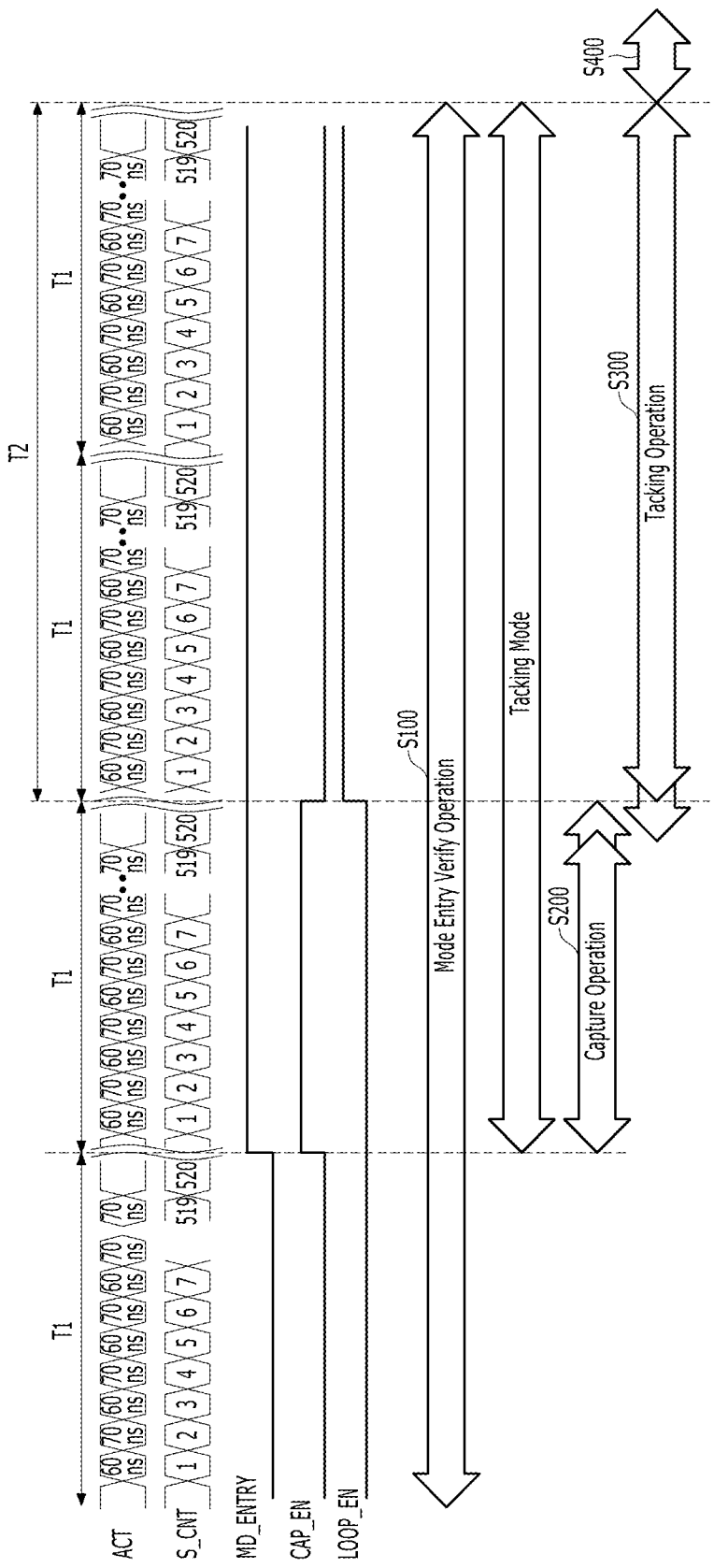
FIG. 8 is a diagram for describing an overall operation of a memory device in accordance with an embodiment of the present invention.

FIG. 8 is a diagram for describing an overall operation of the memory device 100 in accordance with an embodiment of the present invention.

Referring to FIG. 8, the mode entry determination circuit 310 may perform a mode entry verify operation S100 of generating the mode entry signal MD_ENTRY or the mode reset signal MD_RST by checking the number of the short interval signals S_GAP (i.e., the short counting value S_CNT) every first set time T1. For example, when the short counting value S_CNT generated within the first set time T1 is greater than the first threshold, the mode entry signal MD_ENTRY that determines an entry into a tracking mode may be activated.

The tracking control circuit 330 may activate the capture enable signal CAP_EN when the mode entry signal MD_ENTRY is activated. Accordingly, a capture operation S200 may be performed. During the capture operation S200, the tracking circuit 340 may capture the pattern of the short interval signals S_GAP. The capture operation S200 may be performed within a period equal to or shorter than the first set time T1.

The tracking control circuit 330 may activate the tracking enable signal LOOP_EN and deactivate the capture enable signal CAP_EN by determining that the capture operation is completed when the third capture unmatch signal CLAT_UM3 is activated in a state that the capture enable signal CAP_EN is activated. Accordingly, a tracking operation S300 may be performed. During the tracking operation S300, the tracking circuit 340 may generate the duplication flag signal D_FLAG or the loop flag signal L_FLAG by determining whether the captured pattern corresponds to a case where the short interval signals S_GAP of the same length are consecutive, or a case where a combination of the short interval signals S_GAP of two to more different lengths is repetitive. The tracking operation S300 may be performed for an interval equal to or longer than the second set time T2, and preferably, the second set time T2 may be set to an integer times of the first set time T1 (e.g., twice the first set time T1).

At the end of the set second set time T2, the rate control circuit 350 may perform a rate control operation S400 of generating the rate control signal RH_TH based on the duplication flag signal D_FLAG or the loop flag signal L_FLAG.

For reference, the mode entry determination circuit 310 may check whether the tracking mode is valid every first set time T1. The mode entry determination circuit 310 may activate the mode reset signal MD_RST when the short counting value S_CNT counted within the first set time T1 is less than or equal to the first threshold to thereby control the capture operation S200 and the tracking operation S300 to be finished and the mode entry verify operation S100 to be started.

Figure 9:
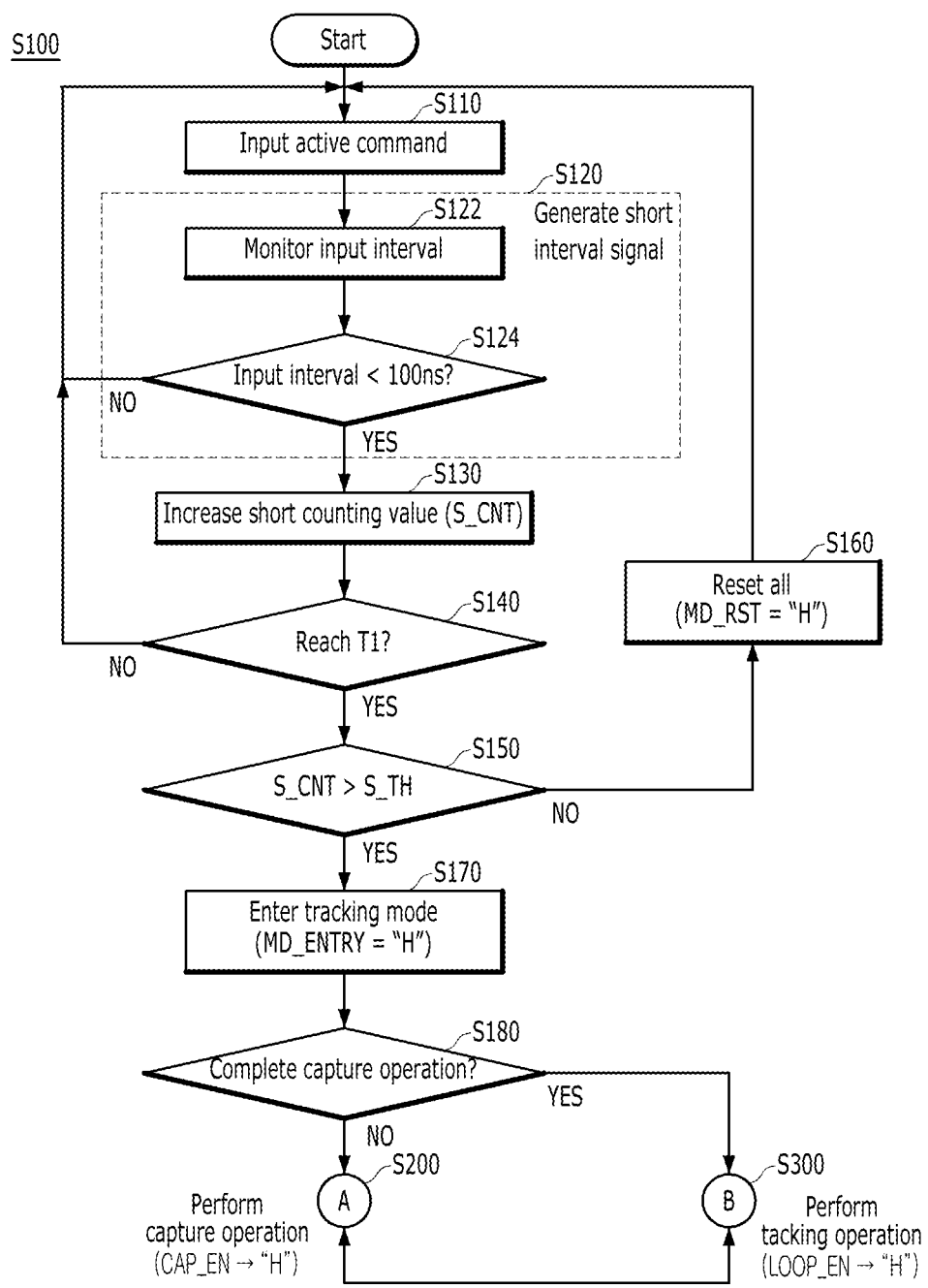
FIG. 9 is a flowchart for describing a mode entry verify operation in accordance with an embodiment of the present invention.

FIG. 9 is a flowchart for describing the mode entry verify operation S100 in accordance with an embodiment of the present invention.

Referring to FIG. 9, the active command ACT is input (at S110). The interval determination circuit 312 of the mode entry determination circuit 310 may generate the short interval signals S_GAP (at S120). For example, the interval determination circuit 312 may monitor the input intervals of the active commands ACT (at S122) and generate the short interval signal S_GAP when a corresponding input interval is shorter than the reference interval (e.g., 100 ns) ("YES" in S124). The interval determination circuit 312 may generate the long interval signal L_GAP when a corresponding input interval is 100 ns or more. The short interval counter 314 may generate the short counting value S_CNT by counting the number of the short interval signals S_GAP (at S130). When the first set time T1 is not reached ("NO" in S140), the above operations S110 to S130 may be repeatedly performed.

When the first set time T1 is reached ("YES" in S140), the entry control circuit 316 may compare the short counting value S_CNT with the first threshold S_TH (at S150). When the short counting value S_CNT is less than or equal to the first threshold S_TH ("NO" in S150), the entry control circuit 316 may activate the mode reset signal MD_RST (at S160). Accordingly, the tracking control circuit 330 may deactivate both the capture enable signal CAP_EN and the tracking enable signal LOOP_EN, and activate the eviction reset signal E_RST, the loop reset signal L_RST, the latch reset signal LAT_RST, and the rate reset signal R_RST. Accordingly, all components in the row-hammer tracking circuit 140 may be initialized, and the mode entry verify operation S100 may be performed again.

On the other hand, when the short counting value S_CNT is greater than the first threshold S_TH ("YES" of S150) within the first set time T1, the entry control circuit 316 may enter the tracking mode by activating the mode entry signal MD_ENTRY (at S170). The tracking control circuit 330 may activate the capture enable signal CAP_EN for performing the capture operation S200 when the capture operation is not performed ("NO" in S180). On the other hand, when the capture operation is performed ("YES" in S180), the tracking control circuit 330 may activate the tracking enable signal LOOP_EN for performing the tracking operation S300. In a section where the tracking mode is maintained, the capture operation S200 and the tracking operation S300 may be complementarily performed.

Figure 10A:
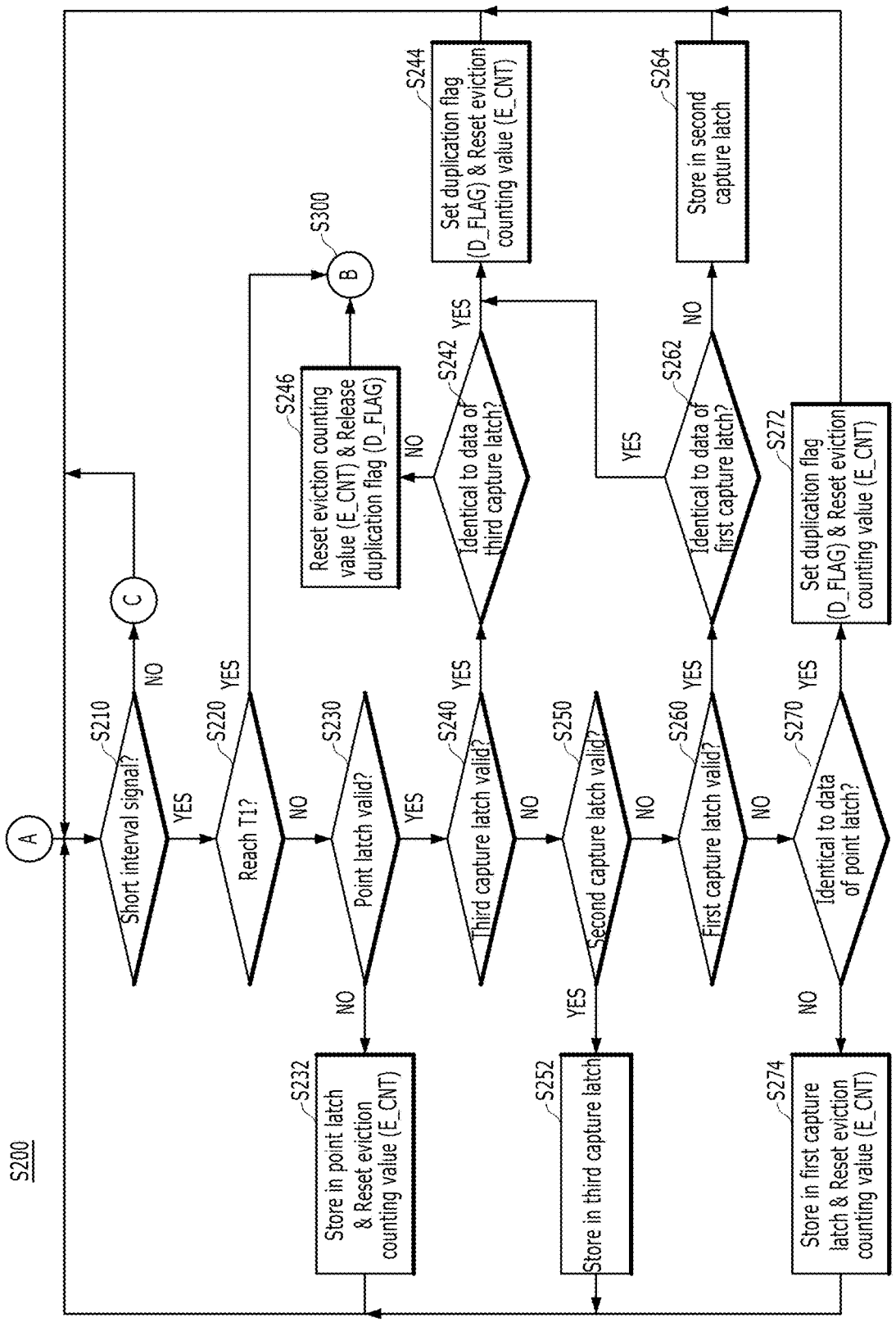
FIGS. 10A and 10B are timing diagrams for describing a capture operation in accordance with an embodiment of the present invention.
Figure 10B:
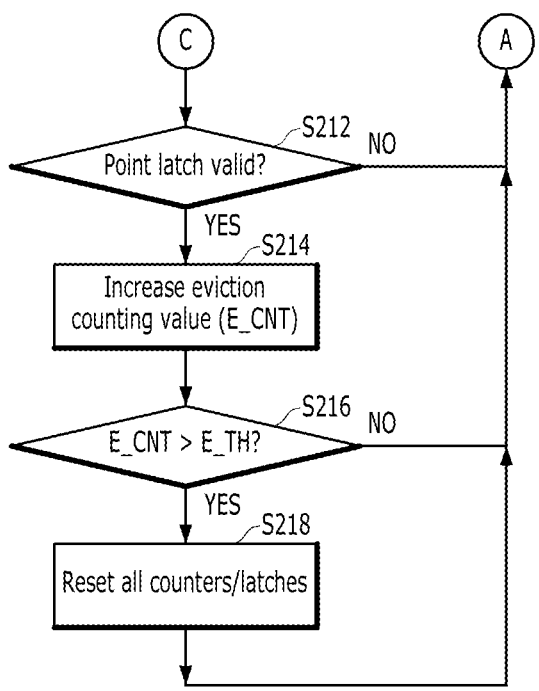

FIGS. 10A and 10B are timing diagrams for describing the capture operation S200 in accordance with an embodiment of the present invention.

Referring to FIG. 10A, the short interval signal S_GAP is generated during the capture operation S200 ("YES" in S210). The point latch P_LAT may selectively store the short interval signal S_GAP according to the capture enable signal CAP_EN and the point latch valid signal PLAT_EN. When data stored in the point latch P_LAT is not valid ("NO" in S230), the point latch P_LAT may store the short interval signal S_GAP (at S232). Thereafter, the point latch P_LAT may activate the point latch valid signal PLAT_EN, and the tracking control circuit 330 may activate the eviction reset signal E_RST to thereby initialize the eviction counting value E_CNT<1:0> (at S232).

Subsequentially, the short interval signal S_GAP is generated ("YES" in S210). Since data stored in the point latch P_LAT is valid ("YES" in S230), and data stored in any of the third capture latch C_LAT3, the second capture latch C_LAT2, and the first capture latch C_LAT1 is not valid ("NO" in S240, "NO" in S250, and "NO" in S260), the first capture latch C_LAT1 may selectively store the short interval signal S_GAP according to a comparison result of the short interval signal S_GAP and the stored data of the point latch P_LAT (at S270). When the short interval signal S_GAP is identical to the stored data of the point latch P_LAT ("YES" in S270), according to the point match signal PLAT_M, the flag setting circuit 347 may set the duplication flag signal D_FLAG, and the tracking control circuit 330 may activate the eviction reset signal E_RST to thereby initialize the eviction counting value E_CNT<1:0> (at S272). On the other hand, when the short interval signal S_GAP is different from the stored data of the point latch P_LAT ("NO" in S270), the first capture latch C_LAT1 may store the short interval signal S_GAP according to the point unmatch signal PLAT_UM (at S274). Then, as the first capture latch valid signal CLAT_EN1 is activated, the tracking control circuit 330 may activate the eviction reset signal E_RST to thereby initialize the eviction counting value E_CNT<1:0> (at S274).

Subsequentially, the short interval signal S_GAP is generated ("YES" in S210). Since data stored in the point latch P_LAT and the first capture latch C_LAT1 is valid ("YES" in S230, "NO" in S240, "NO" in S250, and "YES" in S260), the second capture latch C_LAT2 may selectively store the short interval signal S_GAP according to a comparison result of the short interval signal S_GAP and the stored data of the first capture latch C_LAT1. When the short interval signal S_GAP is identical to the stored data of the first capture latch C_LAT1 ("YES" of S262), according to the first capture match signal CLAT_M1, the flag setting circuit 347 may set the duplication flag signal D_FLAG, and the tracking control circuit 330 may activate the eviction reset signal E_RST to thereby initialize the eviction counting value E_CNT<1:0> (at S244). On the other hand, when the short interval signal S_GAP is different from the stored data of the first capture latch C_LAT1 ("NO" of S262), the second capture latch C_LAT2 may store the short interval signal S_GAP according to the first capture unmatch signal CLAT_UM1 (at S264).

Subsequentially, the short interval signal S_GAP is generated ("YES" in S210). Since data stored in the point latch P_LAT, the first capture latch C_LAT1, and the second capture latch C_LAT2 is valid ("YES" in S230, "NO" in S240, and "YES" in S250), the third capture latch C_LAT3 may store the short interval signal S_GAP (at S252).

Subsequentially, the short interval signal S_GAP is generated ("YES" in S210). Since data stored in all of the point latch P_LAT and the first to third capture latches C_LAT1 to C_LAT3 is valid ("YES" in S230 and "YES" in S240), the tracking control circuit 330 may determine the completion of the capture operation S200 according to a comparison result of the short interval signal S_GAP and the stored data of the third capture latch C_LAT3. When the short interval signal S_GAP is identical to the stored data of the third capture latch C_LAT3 ("YES" of S242), according to the third capture match signal CLAT_M3 the flag setting circuit 347 may set the duplication flag signal D_FLAG, and the tracking control circuit 330_GAP may activate the eviction reset signal E_RST to thereby initialize the eviction counting value E_CNT<1:0> (at S244). On the other hand, when the short interval signal S_GAP is different from the stored data of the third capture latch C_LAT3 ("NO" of S242), according to the third capture unmatch signal CLAT_UM3, the tracking control circuit 330 may activate the eviction reset signal E_RST and the flag setting circuit 347 may release the duplication flag signal D_FLAG (at S246). Accordingly, the capture operation S200 may be completed and the tracking operation S300 may be performed.

When the capture operation S200 is not completed even though the first set time T1 is reached ("YES" of S220), it may correspond to a case where the short interval signals S_GAP of the same length are consecutive. In this case, the tracking control circuit 330 may forcibly terminate the capture operation S200. At this time, the duplication flag signal D_FLAG may maintain a set state.

Meanwhile, the long interval signal L_GAP may be input during the capture operation S200 ("NO" in S210). Referring to FIG. 10B, when the long interval signal L_GAP is input, but data stored in the point latch P_LAT is not valid ("NO" in S212), the capture operation S200 may be performed again. On the other hand, when data stored in the point latch P_LAT is valid ("YES" in S212), the eviction counter 345 may increase the eviction counting value E_CNT <0:1> by "+1" (at S214). The tracking control circuit 330 may compare the eviction counting value E_CNT<0:1> with the second threshold E_TH (at S216). When the eviction counting value E_CNT<0:1> is less than or equal to the second threshold E_TH ("NO" in S216), the capture operation S200 may be performed again. On the other hand, when the eviction counting value E_CNT<0:1> is greater than the second threshold ("YES" in S216), the tracking control circuit 330 may activate the tracking reset signals E_RST, L_RST and LAT_LST, and the rate reset signal R_RST, and the flag setting circuit 347 may release all of the duplication flag signal D_FLAG and the loop flag signal L_FLAG, thereby all of counters and latches may be initialized. Thereafter, the capture operation S200 may be performed again.

FIGS. 11A to 11D are diagrams for describing the capture operation S200 of FIGS. 10A and 10B.

Referring to FIG. 11A, when the short interval signals S_GAP have the first pattern P1 as shown in FIG. 2, data stored in the first to third capture latches C_LAT1 to C_LAT3 is not valid after the short interval signal S_GAP of a first length "6" is stored in the point latch P_LAT. Thereafter, the first set time T1 may be reached and the capture operation S200 may be terminated. In this case, the duplication flag signal D_FLAG may be maintained in a set state.

Referring to FIG. 11B, when the short interval signals S_GAP have the fifth pattern P5 as shown in FIG. 2, the short interval signals S_GAP of a first length "6", a second length "7", a third length "8" and the first length "6" may be sequentially captured in the point latch P_LAT and the first to third capture latches C_LAT1 to C_LAT3, during the capture operation S200. Accordingly, the tracking operation S300 may be performed on a [7-8-6] pattern captured in the first to third capture latches C_LAT1 to C_LAT3.

Referring to FIG. 11C, when the short interval signals S_GAP have the sixth pattern P6 as shown in FIG. 2, the short interval signals S_GAP of a first length "6", a second length "7", a third length "8", and a fourth length "9" may be sequentially captured in the point latch P_LAT and the first to third capture latches C_LAT1 to C_LAT3, during the capture operation S200. Accordingly, the tracking operation S300 may be performed on a [7-8-9] pattern captured in the first to third capture latches C_LAT1 to C_LAT3. In this case, during the tracking operation S300 to be described later, since the short interval signal S_GAP of the first length "6", which is different from the stored data "7" of the first capture latch C_LAT1, will be input, the short interval signal S_GAP of the first length "6" may be stored in the eviction latch E_LAT.

Referring to FIG. 11D, when the short interval signals S_GAP have the seventh pattern P7 as shown in FIG. 2, the short interval signals S_GAP of a first length "6", a second length "7", the second length "7", and the first length "6" may be sequentially captured in the point latch P_LAT and the first to third capture latches C_LAT1 to C_LAT3, during the capture operation S200. Accordingly, the tracking operation S300 may be performed on a [7-7-6] pattern stored in the first to third capture latches C_LAT1 to C_LAT3.

Figure 12B:
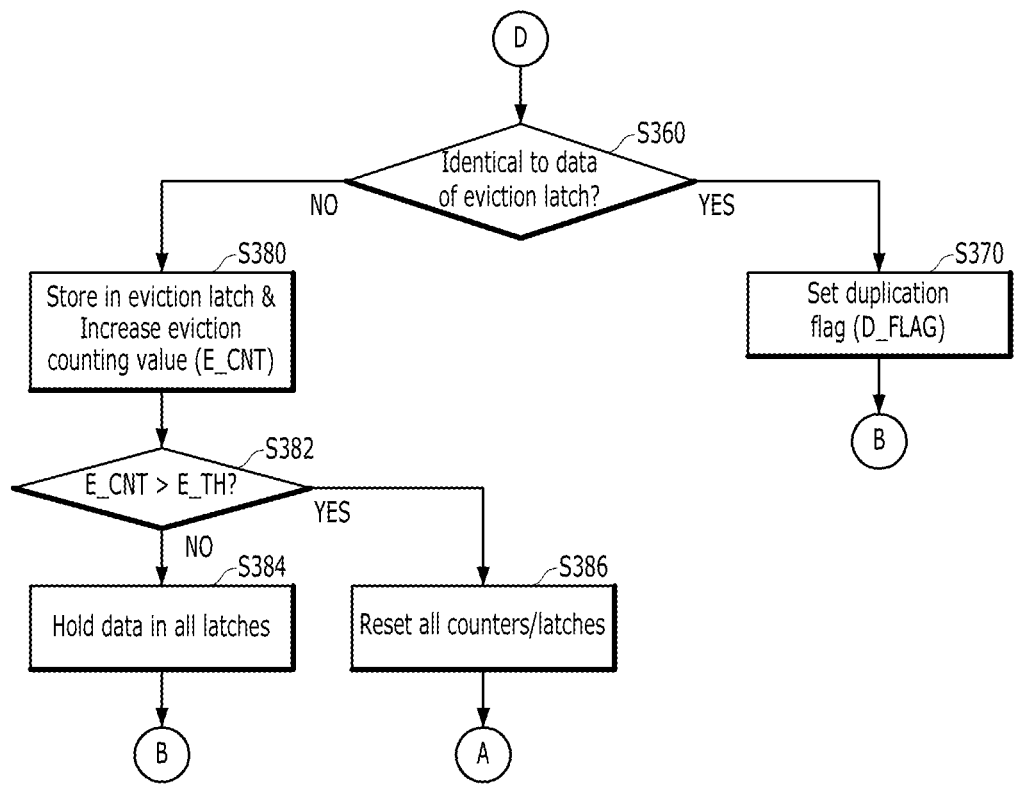

FIGS. 12A and 12B are flowcharts for describing the tacking operation S300 in accordance with an embodiment of the present invention.

Referring to FIG. 12A, during the tracking operation S300, the short interval signal S_GAP may be first input ("YES" in S310) in a state that the loop counting value L_CNT<0:1> is set to an initial value (i.e., "0"). Since the loop counting value L_CNT <0:1> is "0" ("YES" in S320), the first capture comparator C_CMP1 may compare the stored data of the first capture latch C_LAT1 with the short interval signal S_GAP (at S322). When the stored data of the first capture latch C_LAT1 is identical to the short interval signal S_GAP ("YES" of S322), the tracking control circuit 330 may activate the eviction reset signal E_RST according to the first capture match signal CLAT_M1. Accordingly, both the eviction counter 345 and the eviction latch E_LAT may be initialized (at S324). According to the first capture match signal CLAT_M, the loop counter 343 may increase the loop counting value L_CNT <0:1> by "+1", and the flag setting circuit 347 may release the duplication flag signal D_FLAG (at S330). Thereafter, the tracking operation S300 may be continuously performed.

Referring to FIG. 12B, when the stored data of the first capture latch C_LAT1 is different from the short interval signal S_GAP ("NO" of S322), the eviction comparator E_CMP may compare the stored data of the eviction latch E_LAT with the short interval signal S_GAP (at S360). When the stored data of the eviction latch E_LAT is identical to the short interval signal S_GAP ("YES" in S360), the flag setting circuit 347 may set the duplication flag signal D_FLAG (at S370). On the other hand, when the stored data of the eviction latch E_LAT is different from the short interval signal S_GAP ("NO" of S360), the eviction latch E_LAT may store the short interval signal S_GAP, and the eviction counter 345 may increase the eviction counting value E_CNT<0:1> by "+1" according to the eviction unmatch signal ELAT_UM (at S380). The tracking control circuit 330 may compare the eviction counting value E_CNT<0:1> with the second threshold E_TH (at S382). When the eviction counting value E_CNT <0:1> is less than or equal to the second threshold E_TH ("NO" in S382), the tracking operation S300 may be performed again while maintaining (i.e., holding) data in stored in all latches (at S384). On the other hand, when the eviction counting value E_CNT<0:1> is greater than the second threshold E_TH ("YES" in S382), the tracking control circuit 330 may activate all tracking reset signals E_RST, L_RST and LAT_LST, and the rate reset signal R_RST (at 386). Thereafter, the capture operation S200 may be performed again.

Referring back to FIG. 12A, the short interval signal S_GAP may be input in a state that the loop counting value L_CNT<0:1> is set to "1" ("YES" in S310, "NO" in S320). Since the loop counting value L_CNT <0:1> is "1" ("YES" in S340), the first capture comparator C_CMP1 can compare the stored data of the first capture latch C_LAT1 with the short interval signal S_GAP (at S342). When the stored data of the first capture latch C_LAT1 is identical to the short interval signal S_GAP ("YES" in S342), the flag setting circuit 347 may set the duplication flag signal D_FLAG according to the first capture match signal CLAT_M1 (at S344). On the other hand, when the stored data of the first capture latch C_LAT1 is identical to the short interval signal S_GAP ("NO" of S342), the second capture comparator C_CMP2 may compare the stored data of the second capture latch C_LAT2 with the short interval signal S_GAP (at S346). When the stored data of the second capture latch C_LAT2 is identical to the short interval signal S_GAP ("YES" in S346), the loop counter 343 may increase the loop counting value L_CNT<0:1> by "+1", and the flag setting circuit 347 may release the duplication flag signal D_FLAG (at S330). Thereafter, the tracking operation S300 may be continuously performed.

When the stored data of the second capture latch C_LAT2 is different from the short interval signal S_GAP ("NO" in S346), the operations S360 to S386 described in FIG. 12B may be performed.

Referring back to FIG. 12A, the short interval signal S_GAP may be input in a state that the loop counting value L_CNT<0:1> is set to "2" ("YES" in S310, "NO" in S320, "NO" in S340). The third capture comparator C_CMP3 may compare the stored data of the first capture latch C_LAT1 with the short interval signal S_GAP (at S350). When the stored data of the third capture latch C_LAT3 is identical to the short interval signal S_GAP ("YES" of S350), the flag setting circuit 347 may set the loop flag signal L_FLAG according to the third capture match signal CLAT_M3. (at S352). Thereafter, the tracking control circuit 330 may activate the eviction reset signal E_RST and the loop reset signal L_RST according to the third capture match signal CLAT_M3. Accordingly, all of the eviction counter 345, the eviction latch E_LAT, and the loop counter 343 may be initialized (at S354). Thereafter, the tracking operation S300 may be continuously performed.

When the stored data of the third capture latch C_LAT3 is different from the short interval signal S_GAP ("NO" in S350), the operations S360 to S386 described in FIG. 12B may be performed.

Hereinafter, the rate control operation S400 for generating the rate control signal RH_TH based on the duplication flag signal D_FLAG or the loop flag signal L_FLAG will be described.

Figure 13:
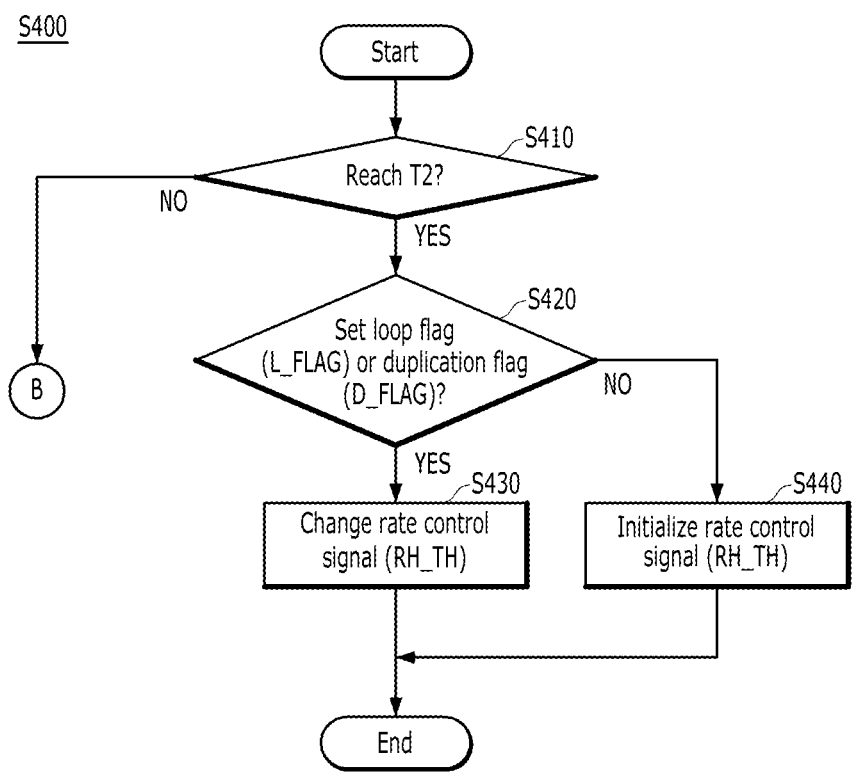
FIG. 13 is a flowchart for describing a rate adjust operation in accordance with an embodiment of the present invention.

FIG. 13 is a flowchart for describing the rate control operation S400 in accordance with an embodiment of the present invention.

Referring to FIG. 13, the tracking operation S300 may be performed until the second set time T2 is reached ("NO" in S410). When the second set time T2 is reached ("YES" in S410), the rate control circuit 350 may check whether the duplication flag signal D_FLAG or the loop flag signal L_FLAG is set (at S420).

When the duplication flag signal D_FLAG or the loop flag signal L_FLAG is set ("YES" in S420), the rate control circuit 350 may change the rate control signal RH_TH (at S430). For example, the rate control circuit 350 may generate the rate control signal RH_TH so that the target refresh rate is more increased (i.e., frequent).

On the other hand, when both the duplication flag signal D_FLAG and the loop flag signal L_FLAG are released ("NO" in S420), the rate control circuit 350 may initialize the rate control signal RH_TH to a preset default value (at S440).

Hereinafter, an operation of a memory device according to an embodiment of the present invention will be described as an example with reference to the drawings.

Figure 14:
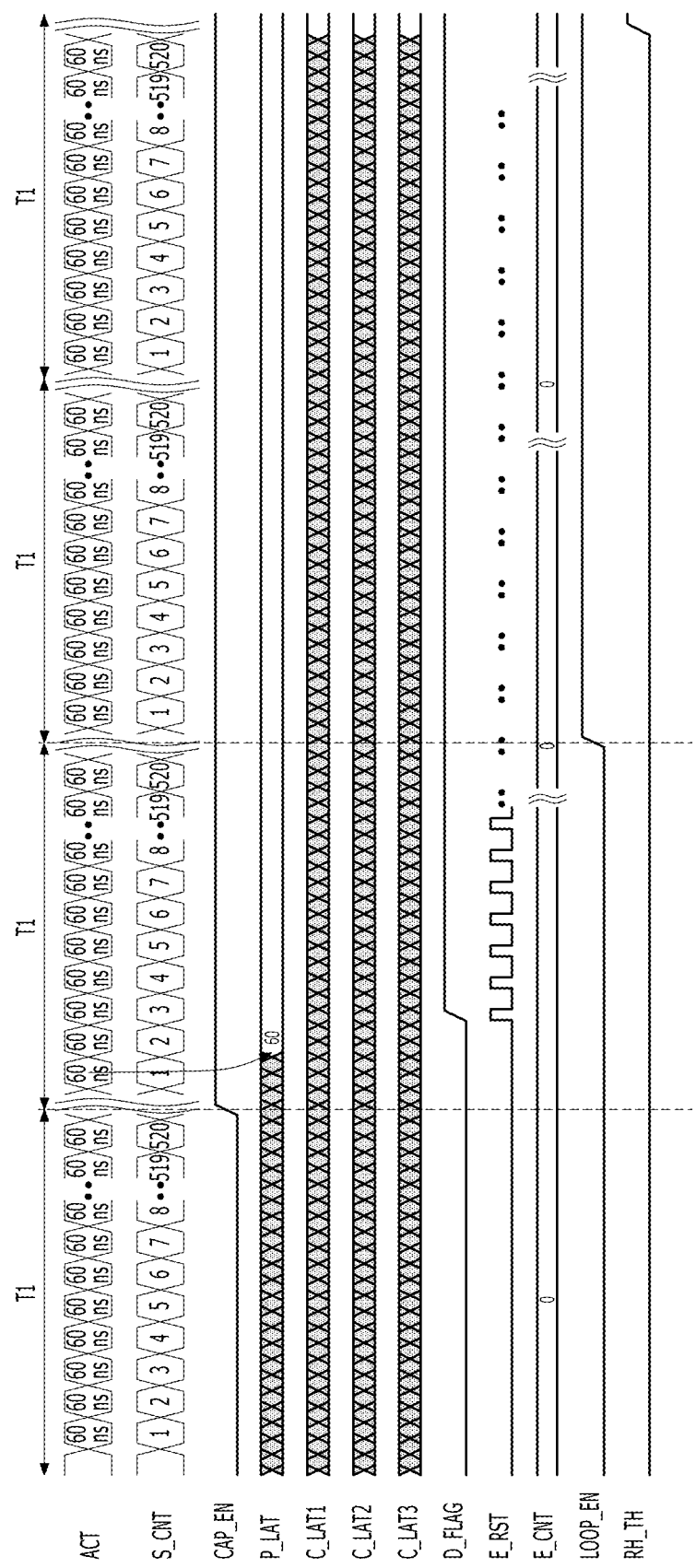
FIGS. 14 and 15 are timing diagrams illustrating an operation of a memory device according to an embodiment of the present invention.

FIG. 14 is a timing diagram illustrating an operation of a memory device according to an embodiment of the present invention. FIG. 14 shows a case where the short interval signals S_GAP of the same length are consecutive as the active commands ACT are provided at the input interval of 60 ns according to an embodiment of the present invention.

Referring to FIG. 14, the mode entry verify operation S100 described in FIG. 8 is performed every first set time T1, and the short counting value S_CNT generated within the first set time T1 is determined to be greater than the first threshold. Thus, the tracking mode may be entered.

First, as the capture enable signal CAP_EN is activated, the capture operation S200 described in FIGS. 10A and 10B may be performed to store the short interval signal S_GAP which is first input, in the point latch P_LAT (see FIG. 11A). Thereafter, data stored in the first to third capture latches C_LAT1 to C_LAT3 is not valid. Whenever the same short interval signal S_GAP as the stored data of the point latch (P_LAT) is input, the eviction reset signal E_RST is activated, and accordingly, the eviction counting value E_CNT<0:1> may remain initialized. In this case, the duplication flag signal D_FLAG may be maintained in a set state. After that, when the first set time T1 is reached, the capture enable signal CAP_EN may be deactivated, and the capture operation S200 may be terminated.

Thereafter, the tracking enable signal LOOP_EN may be activated and the tracking operation S300 described in FIGS. 12A and 12B may be performed. During the tracking operation S300, the short interval signal S_GAP which is first input is stored in the eviction latch E_LAT, and then the duplication flag signal D_FLAG may be maintained even if the short interval signal S_GAP is input.

At the end of the second set time T2, the rate control operation S400 described in FIG. 13 may be performed. That is, the rate control circuit 350 may change the rate control signal RH_TH by verifying that the duplication flag signal D_FLAG is set.

Figure 15:
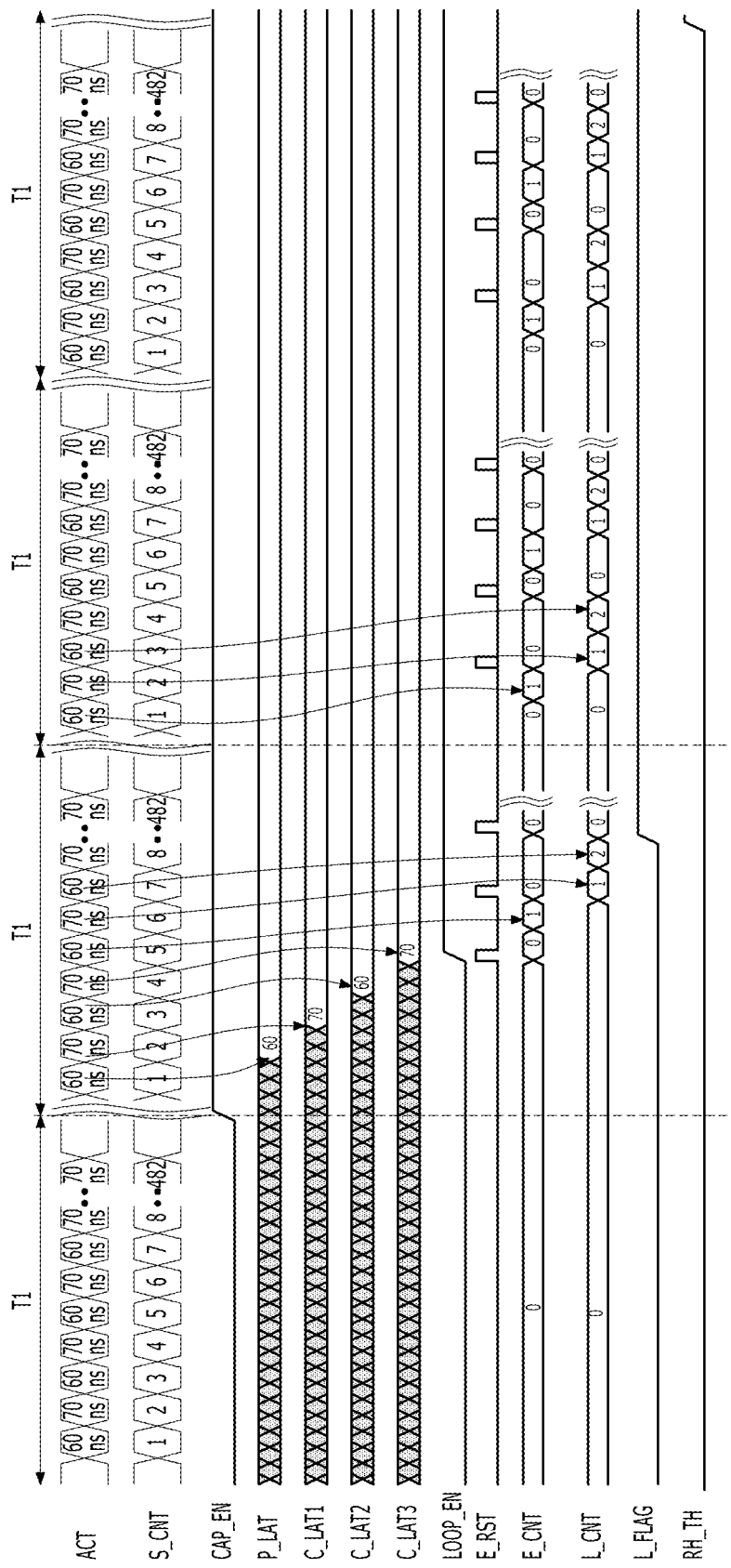

FIG. 15 is a timing diagram illustrating an operation of a memory device according to an embodiment of the present invention. FIG. 15 shows a case where the short interval signals S_GAP are alternatively inputted at 60 ns and 70 ns intervals, i.e., a case where a combination of two or more short interval signals S_GAP of the different lengths is repetitive, according to an embodiment of the present invention.

Referring to FIG. 15, the mode entry verify operation S100 described in FIG. 8 is performed every first set time T1, and the short counting value S_CNT generated within the first set time T1 is determined to be greater than the first threshold and may enter the tracking mode.

As the capture enable signal CAP_EN is activated, the capture operation S200 described in FIGS. 10A and 10B may be performed so that the short interval signals S_GAP of the first length "6", the second length "7", the first length "6", and the second length "7" may be sequentially captured in the point latch P_LAT and the first to third capture latch C_LAT1 to C_LAT3.

Thereafter, the tracking enable signal LOOP_EN may be activated and the tracking operation S300 described in FIGS. 12A and 12B may be performed.

During the tracking operation S300, the short interval signal S_GAP of the first length "6" (i.e., 60 ns) is first input in a state that the loop counting value L_CNT<0:1> is "0". Since both of the stored data of the first capture latch C_LAT1 and the eviction latch E_LAT are different from the short interval signal S_GAP, the short interval signal S_GAP may be stored in the eviction latch E_LAT, to thereby increase the eviction counting value E_CNT<0:1> by "+1". In this case, the loop counting value L_CNT<0:1> may be maintained at "0".

After that, the short interval signal S_GAP of the second length "7" (i.e., 70 ns) is input. Since the stored data of the first capture latch C_LAT1 is identical to the short interval signal S_GAP, both of the eviction latch E_LAT and the eviction counting value E_CNT<0<:0> may be reset, and the loop counting value L_CNT<0:1> may be increased by "+1" to be "1".

After that, the short interval signal S_GAP of the first length "6" (i.e., 60 ns) is input. Since the stored data of the second capture latch C_LAT2 is identical to the short interval signal S_GAP, the loop counting value L_CNT<0:1> may be increased by "+1" to be "2".

After that, the short interval signal S_GAP of the second length "7" (i.e., 70 ns) is input. Since the stored data of the third capture latch C_LAT3 is identical to the short interval signal S_GAP, the loop flag signal L_FLAG may be set, and the loop counting value L_CNT<0:1> may be initialized. In this way, the tracking operation S300 may be performed on a [7-6-7] pattern captured in the first to third capture latches C_LAT1 to C_LAT3.

At the end of the second set time T2, the rate control operation S400 described in FIG. 13 may be performed. That is, the rate control circuit 350 may change the rate control signal RH_TH by verifying that the loop flag signal L_FLAG is set.

As described above, in the embodiment of the present invention, the row-hammer tracking circuit 140 may capture the pattern of short interval signals and store the captured pattern in latches during the capture operation S200, and track whether the pattern of the short interval signals are repeated based on the captured pattern during the tracking operation S300. As a result of tracking, the row-hammer tracking circuit 140 may generate the duplicate flag signal D_FLAG by detecting a case where the short interval signals having the same length are consecutive, and or generate the loop flag signal L_FLAG by detecting a case where a combination of short interval signals having two to four different lengths is repetitive.

In the above embodiment, the issuance frequency of the target refresh command TREF generated in the memory device 100 has been adjusted, but the present invention is not limited to this. In the following embodiment, a method of adjusting an issuance frequency of a refresh management command RFM issued by a memory controller will be described.

Figure 16:
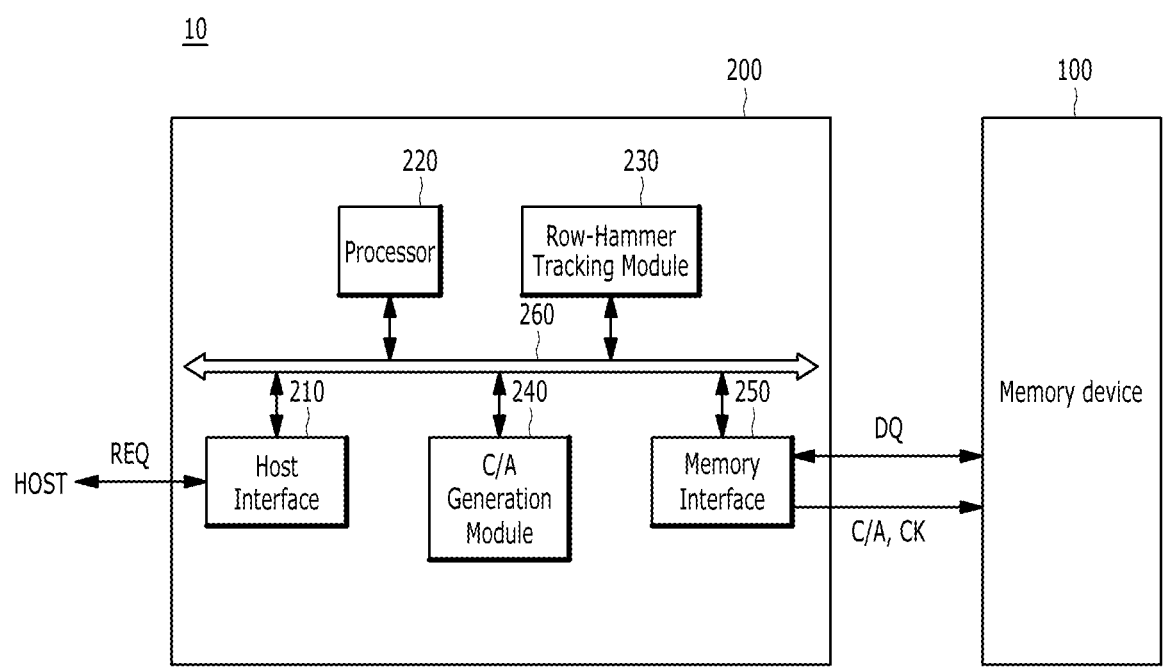
FIG. 16 is a block diagram illustrating a memory system in accordance with an embodiment of the present invention.

FIG. 16 is a block diagram illustrating a memory system 10 in accordance with an embodiment of the present invention.

Referring to FIG. 16, the memory system 10 may include a memory device 100 and a memory controller 200.

The memory controller 200 may control a general operation of the memory system 10 and it may control general data exchange between a host and the memory device 100. The memory controller 200 may generate a command/address signal C/A according to a request REQ from the host and provide the generated command/address signal C/A to the memory device 100. The memory controller 200 may provide a clock CK together with the command/address signal C/A to the memory device 100. The memory controller 200 may provide data DQ corresponding to the request REQ provided from the host to the memory device 100. The memory controller 200 may receive the data DQ read from the memory device 100 and provide the data DQ to the host.

In detail, the memory controller 200 may include a host interface 210, a processor 220, a row-hammer tracking module 230, a command/address (C/A) generation module 240, a memory interface 250, and a bus 260.

The host interface 210 may be configured to communicate with the host connected to the memory system 10 under the control of the processor 220. For example, the host interface 210 may receive the request REQ from the host and provide data to the host by receiving the data DQ read from the memory device 100 through the memory interface 250.

The processor 220 may perform various types of computational and/or other operations for controlling the memory device 100, and/or may execute instructions in the form of firmware or other types of software. The processor 220 may receive the request REQ from the host through the host interface 210. The processor 220 may generate various commands corresponding to the request REQ, such as an active command ACT, a precharge command PCG, a normal refresh command REF, a refresh management command RFM, a read command RD, a write command WT, a mode register command and the like, and an address. The processor 220 may change the order in which the request REQ is received from the host and the order of the operation to be instructed to the memory device 100 to improve the performance of the memory device 100. For example, the processor 220 may adjust the order so that a write operation is performed before a read operation, even if the host requests the read operation of the memory device 100 first and the write operation later. The processor 220 may control overall operations of the host interface 210, the row-hammer tracking module 230, the C/A generation module 240, and the memory interface 250.

The row-hammer tracking module 230 may be substantially the same configuration and perform substantially the same operation as the row-hammer tracking circuit 140 described in FIGS. 1 to 15. That is, the row-hammer tracking module 230 may monitor input intervals between the active commands ACT to generate short interval signals S_GAP each having one of the first to n-th lengths, and determine whether a pattern of the short interval signals S_GAP corresponds to a row-hammer attack pattern to generate a rate control signal RH_TH. For example, the row-hammer tracking module 230 may determine that the pattern of the short interval signals S_GAP correspond to the row-hammer attack pattern when the short interval signals S_GAP of the same length among the first to fourth length are consecutive, or when a combination of two or more short interval signals S_GAP of the different lengths is repetitive.

The C/A generation module 240 may generate the command/address signal C/A based on the commands and address provided from the processor 220 and the rate control signal RH_TH provided from the row-hammer tracking module 230. The C/A generation module 240 may provide the active command or the precharge command together with an address to be activated, as the command/address signal C/A, provide the normal refresh command as the command/address signal C/A, and provide the refresh management command RFM as the command/address signal C/A. In the embodiment, the C/A generation module 240 may provide the refresh management command RFM as the command/address signal C/A by determining an issuance frequency of the refresh management command RFM according to the rate control signal RH_TH.

According to an embodiment, the row-hammer tracking module 230 may collect information on word lines vulnerable to a row-hammer attack in the memory device 100, based on the command and address provided by the processor 220. The row-hammer tracking module 230 may collect information on word lines vulnerable to a row-hammer attack in the memory device 100, using a combination of various methods, such as counting the number of activations (or accesses) for the word lines of the memory device 100 and randomly sampling a row address for the word lines of the memory device 100. In this case, the row-hammer tracking module 230 may transfer the collected information and the rate control signal RH_TH to the command/address module 240, and the command/address module 240 may provide the refresh management command together with an address for designating a target word line, as the command/address signal C/A.

The memory interface 250 may be configured to communicate with the memory device 100 under the control of the processor 220. For example, the memory interface 250 may transmit the command/address signal C/A and the data DQ to the memory device 100 and transmit the data DQ read from the memory device 100 to the host interface 210.

The processor 220 may transmit data between the host interface 210, the row-hammer tracking module 230, the C/A generation module 240, and the memory interface 250 via the bus 260. According to an embodiment, the host interface 210, the row-hammer tracking module 230, the C/A generation module 240, and the memory interface 250 may communicate with each other independently without passing through the bus 260. For example, the row-hammer tracking module 230 and the host interface 210 may communicate directly with each other without passing through the bus 260. The row-hammer tracking module 230 and the memory interface 250 may communicate with each other directly without passing through the bus 260. The host interface 210 and the memory interface 250 may also communicate directly with each other without passing through the bus 260.

The memory device 100 may perform an active operation, a precharge operation, a refresh operation, a write operation, and a read operation according to the clock CK, the command/address signal C/A, and/or the data DQ, which are provided from the memory controller 200. The memory device 100 may be a memory that requires a refresh operation. The memory device 100 may be substantially the same as the memory device 100 described in FIG. 1. According to an embodiment, the memory device 100 may omit the row-hammer tracking circuit 140.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims. Further, the embodiments may be combined to form additional embodiments.

For example, for the logic gates and transistors provided as examples in the above-described embodiments, different positions and types may be implemented depending on the polarity of the input signal.

What is claimed is:

1. A memory device comprising:
   a row-hammer tracking circuit configured to:
      generate short interval signals each having one of first to n-th lengths based on input intervals between active commands, and
      generate a rate control signal based on whether a pattern of the short interval signals corresponds to a row-hammer attack pattern; and
   a target command issue circuit configured to adjust a frequency of a target refresh operation according to the rate control signal.

2. The memory device of claim 1, wherein the row-hammer tracking circuit generates the rate control signal by determining that the pattern of the short interval signals corresponds to the row-hammer attack pattern when:
   the short interval signals having the same length are consecutive, or
   a combination of the short interval signals having two to more different lengths is repetitive.

3. The memory device of claim 1, wherein the row-hammer tracking circuit includes:
   a mode entry determination circuit configured to:
      generate the short interval signals based on the input intervals, and
      generate a mode entry signal based on a number of the short interval signals every first set time;
   a tracking operation circuit configured to generate, according to the mode entry signal, a first flag signal and a second flag signal based on the pattern of the short interval signals; and
   a rate control circuit configured to generate the rate control signal based on the first flag signal and the second flag signal.

4. The memory device of claim 3, wherein the mode entry determination circuit includes:
   an interval determination circuit configured to generate the short interval signals according to the input intervals each shorter than a reference interval;
   a short interval counter initialized every first set time and configured to generate a short counting value based on the number of the short interval signals; and
   an entry control circuit configured to generate the mode entry signal when the short counting value is greater than a first threshold.

5. The memory device of claim 3, wherein the tracking operation circuit generates:
   the first flag signal when the short interval signals having the same length are consecutive, and
   the second flag signal when a combination of the short interval signals having two to more different lengths is repetitive.

6. The memory device of claim 3, wherein the tracking operation circuit includes:
   a tracking control circuit configured to generate a capture enable signal or a tracking enable signal according to the mode entry signal; and
   a tracking circuit configured to:
      capture the pattern of the short interval signals according to the capture enable signal, and
      generate, according to the tracking enable signal, the first flag signal and the second flag signal based on whether the captured pattern is repeated.

7. The memory device of claim 6, wherein the tracking control circuit includes:
   an operational setting circuit configured to activate the capture enable signal or the tracking enable signal according to the mode entry signal; and
   an initialization circuit configured to generate tracking reset signals and a rate reset signal according to the capture enable signal, the tracking enable signal and tracking signals provided from the tracking circuit.

8. The memory device of claim 6, wherein the tracking circuit includes:
   a pattern capture circuit configured to:
      capture the pattern of the short interval signals according to the capture enable signal, and
      generate capture comparison signals by comparing the respective short interval signals with the captured pattern according to the tracking enable signal and a loop counting value;
   a loop counter configured to generate the loop counting value according to the tracking enable signal and the capture comparison signals; and
   a flag setting circuit configured to generate the first flag signal and the second flag signal according to the capture enable signal, the tracking enable signal, the loop counting value and the capture comparison signals.

9. The memory device of claim 8, wherein the pattern capture circuit includes:

a point latch and a plurality of capture latches configured to sequentially store the pattern of the short interval signals according to the capture enable signal;

a point comparator and a plurality of capture comparators corresponding to the point latch and the capture latches, respectively, and each configured to compare the data of a corresponding latch with the individual short interval signals when the data of the corresponding latch is valid or the loop counting value of a preset value is input;

an eviction latch configured to store the short interval signals according to the tracking enable signal and results of the comparing of the capture comparators; and an eviction comparator configured to compare the data of the eviction latch with the short interval signals, wherein the capture comparison signals include signals respectively indicating whether the data of the latches are valid and signals respectively indicating results of the comparing of the comparators.

10. The memory device of claim 9, wherein the tracking circuit further includes an eviction counter configured to increase an eviction counting value when:

a long interval signal is generated in a state that the capture enable signal is activated and in a state that the data of the point latch is valid, wherein the long interval signal is generated according to the input intervals each equal to or longer than a reference interval, or any piece of the data of the capture latches is different from the short interval signals and the data of the eviction latch is different from the short interval signals, in a state that the tracking enable signal is activated, and wherein the flag setting circuit is further configured to initialize the first flag signal and the second flag signal when the eviction counting value is greater than a second threshold.

11. The memory device of claim 1, wherein the target command issue circuit adjusts the frequency by changing a refresh rate according to the rate control signal.

12. A row-hammer tracking device comprising:

a mode entry determination circuit configured to:
generate short interval signals each having one of first to n-th lengths based on input intervals between active commands, and
generate a mode entry signal based on a number of the short interval signals;

a tracking control circuit configured to generate a capture enable signal or a tracking enable signal according to the mode entry signal;

a tracking circuit configured to:
capture a pattern of the short interval signals according to the capture enable signal, and
generate, according to the tracking enable signal, a first flag signal and a second flag signal based on whether the captured pattern is repeated; and a rate control circuit configured to generate a rate control signal for adjusting, based on the first flag signal and the second flag signal, a frequency of a target refresh operation.

13. The row-hammer tracking device of claim 12, wherein the mode entry determination circuit includes:

an interval determination circuit configured to generate the short interval signals according to the input intervals each shorter than a reference interval;

a short interval counter initialized every first set time and configured to generate a short counting value based on the number of the short interval signals; and an entry control circuit configured to generate the mode entry signal when the short counting value is greater than a first threshold.

14. The row-hammer tracking device of claim 12, wherein the tracking circuit generates:

the first flag signal when the short interval signals having the same length are consecutive, and the second flag signal when a combination of the short interval signals having two to more different lengths is repetitive.

15. The row-hammer tracking device of claim 12, wherein the tracking circuit includes:

a pattern capture circuit configured to:
capture the pattern of the short interval signals according to the capture enable signal, and
generate capture comparison signals by comparing the respective short interval signals with the captured pattern according to the tracking enable signal and a loop counting value;

a loop counter configured to generate the loop counting value according to the tracking enable signal and the capture comparison signals; and a flag setting circuit configured to generate the first flag signal and the second flag signal according to the capture enable signal, the tracking enable signal, the loop counting value and the capture comparison signals.

16. The row-hammer tracking device of claim 15, wherein the pattern capture circuit includes:

a point latch and a plurality of capture latches configured to sequentially store the pattern of the short interval signals according to the capture enable signal;

a point comparator and a plurality of capture comparators corresponding to the point latch and the capture latches, respectively, and each configured to compare the data of a corresponding latch with the short interval signals when the data of the corresponding latch is valid or the loop counting value of a preset value is input;

an eviction latch configured to store the short interval signals according to the tracking enable signal and results of the comparing of the capture comparators; and an eviction comparator configured to compare the data of the eviction latch with the short interval signals, wherein the capture comparison signals include signals respectively indicating whether the data of the latches are valid and signals respectively indicating results of the comparing of the comparators.

17. The row-hammer tracking device of claim 16, wherein the tracking circuit further includes an eviction counter configured to increase an eviction counting value when:

a long interval signal is input in a state that the capture enable signal is activated and in a state that the data of the point latch is valid, wherein the long interval signal is generated according to the input intervals each equal to or longer than a reference interval, or any piece of the data of the capture latches is different from the short interval signals and the data of the eviction latch is different from the short interval signals, in a state that the tracking enable signal is activated, and wherein the flag setting circuit is further configured to initialize the first flag signal and the second flag signal when the eviction counting value is greater than a second threshold.

18. An operating method of a memory device, the operating method comprising:
- generating short interval signals each having one of first to n-th lengths based on input intervals between active commands;
- performing a capture operation for capturing a pattern of the short interval signals based on a number of the short interval signals;
- generating a first flag signal and a second flag signal based on whether the captured pattern of the short interval signals corresponds to a row-hammer attack pattern; and
- adjusting a frequency of a target refresh operation according to the first flag signal and the second flag signal.

19. The operating method of claim 18, wherein the generating of the first and second flag signals includes determining that the captured pattern of the short interval signals corresponds to the row-hammer attack pattern when:
- the short interval signals having the same length are consecutive, or
- a combination of the short interval signals having two to more different lengths is repetitive.

20. The operating method of claim 18, wherein the performing includes:
- generating the short interval signals according to the input intervals each shorter than a reference interval;
- generating a short counting value based on the number of the short interval signals while initializing the short counting value every first set time; and
- performing the capture operation when the short counting value is greater than a first threshold.

21. The operating method of claim 18, wherein the capture operation includes:
- storing a first one of the short interval signals in a point latch;
- storing a second one of the short interval signals in a first capture latch when the data of the point latch is different from the second short interval signal;
- storing a third one of the short interval signals in a second capture latch when the data of the first capture latch is different from the third short interval signal; and
- storing a fourth one of the short interval signals in a third capture latch, and
wherein the capture operation finishes when the data of the third capture latch is different from a fifth one of the short interval signals.

22. The operating method of claim 21, wherein the generating of the first and second flag signals includes:
- storing the fifth short interval signal in an eviction latch when any piece of the data of the first to third capture latches is different from the fifth short interval signal;
- generating the first flag signal when the short interval signals each matching any piece of the data of the first to third capture latches are consecutive; and
- generating the second flag signal when a combination of the short interval signals respectively corresponding to the data of the first to third capture latches and the eviction latch is repetitive.

23. The operating method of claim 22, further comprising:
increasing an eviction counting value when:
- a long interval signal is input in a state that a capture enable signal is activated and in a state that the data of the point latch is valid, or
- any piece of the data of the first to third capture latches is different from the short interval signals and the data of the eviction latch is different from the short interval signals, in a state that a tracking enable signal is activated; and
- initializing the first flag signal and the second flag signal when the eviction counting value is greater than a second threshold.

24. The operating method of claim 18, wherein the adjusting the frequency includes increasing the frequency when any of the first flag signal and the second flag signal is generated.

* * * * *